United States Patent
Fine et al.

(10) Patent No.: US 9,361,416 B2
(45) Date of Patent: Jun. 7, 2016

(54) DYNAMIC RECONFIGURATION OF PROGRAMMABLE HARDWARE

(71) Applicant: EMPIRE TECHNOLOGY DEVELOPMENT LLC, Wilmington, DE (US)

(72) Inventors: Kevin Fine, Yverdon-les-Bains (CH); Ezekiel Kruglick, Poway, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 284 days.

(21) Appl. No.: 13/994,882

(22) PCT Filed: Jan. 30, 2013

(86) PCT No.: PCT/US2013/023891
§ 371 (c)(1),
(2) Date: Jun. 17, 2013

(87) PCT Pub. No.: WO2014/120157
PCT Pub. Date: Aug. 7, 2014

(65) Prior Publication Data
US 2014/0215424 A1    Jul. 31, 2014

(51) Int. Cl.
*G06F 17/50* (2006.01)
(52) U.S. Cl.
CPC .................................. *G06F 17/5054* (2013.01)
(58) Field of Classification Search
CPC ......................... G06F 17/5054; G06F 17/5072
See application file for complete search history.

(56) References Cited

U.S. PATENT DOCUMENTS

2011/0161955 A1* 6/2011 Woller et al. .................. 718/1
2012/0291027 A1* 11/2012 Chiang et al. ................ 718/1

FOREIGN PATENT DOCUMENTS

WO    PCT/US13/23891    1/2013

OTHER PUBLICATIONS

Sim. "Hardware-Software Codesign for Run-Time Reconfigurable FPGA-Based Systems." Jan. 2010.*
Bazargan. "Fast Template Placement for Reconfigurable Computing Systems." Sep. 1999.*
So. "BORPH: An Operating System for FPGA-Based Reconfigurable Computers." 2007.*
International Searching Authority, International Search Report and Written Opinion for PCT/US13/23891, Apr. 24, 2013, 16 pages.
Ahmadinia, A New Approach for On-line Placement on Reconfgurable Devices, Apr. 26, 2004, 7 pages.
Baker, Orthogonal Packings in Two Dimensions, Nov. 1980, 10 pages.

(Continued)

*Primary Examiner* — Vuthe Siek
*Assistant Examiner* — Aric Lin
(74) *Attorney, Agent, or Firm* — Jensen & Puntigam, PS

(57) ABSTRACT

Technologies related to dynamic reconfiguration of programmable hardware are generally described. In some examples, coprocessor regions in programmable hardware such as a Field Programmable Gate Array (FPGA) may be dynamically assigned to transition the FPGA from a starting arrangement of coprocessor regions to an efficient arrangement. A placement algorithm may be executed to determine the efficient arrangement, and a path finding algorithm may be executed to determine path finding operations leading from the starting arrangement to the efficient arrangement. The path finding operations may be performed to implement the transition.

17 Claims, 11 Drawing Sheets

(56) References Cited

OTHER PUBLICATIONS

Bazargan, Fast Template Placement for Reconfigurable Computing Systems, Sep. 16, 1999, 28 pages.
Bazargan, 3-D Floorplanning: Simulated Annealing and Greedy Placement Methods for Reconfigurable Computing Systems, 2000, 10 pages.
Belaid, New Three-Level Resource Management Enhancing Quality of Offline Hardware Task Placement on FPGA, Nov. 14, 2009, 20 pages.
Compton, Configuration Relocation and Defragmentation for Run-Time Reconfigurable Computing, 2002, 16 pages.
Cui, An Efficient Algorithm for Online Soft Real-Time Task Placement on Reconfigurable Hardware Devices, May 7, 2007, 9 pages.
Delahunty, Server Virtualization, Aug. 2011, 7 pages.
El Farag, Improving Utilization of Reconfigurable Resources Using Two Dimensional Compaction, 2007, 6 pages.
Gericota, On-line Defragmentation for Run-Time Partially Reconfigurable FPGAs, 2002, 10 pages.
Gericota, Assessing Defragmentation Strategies for FPGAs, 2004, 4 pages.
Greskamp, A Virtual Machine for Merit-Based Runtime Reconfiguration, Apr. 18, 2005, 2 pages.
Hotoleanu, Implementation of a RTOS service for the management of the reconfiguration, Oct. 27, 2011, 40 pages.
Jakobs, On genetic algorithms for the packing of polygons, Jun. 1993, 17 pages.
Lodi, Two-dimensional packing problems: A survey, Mar. 9, 2001, 12 pages.
Luna Innovations Incorporated, Dynamic Module Server for Routing-Driven FPGA Defragmentation (Abstract), 2005, 1 page.
Manet, RECOPS: Reconfigurable Programmable Devices for Military Hardware, 2007, 6 pages.
Sim, Hardware-software codesign for run-time reconfigurable FPGA-based systems, Jan. 2010, 143 pages.
Sims, Carousel's Expert Walks Through Major Benefits of Virtualization, Jul. 6, 2011, 3 pages.
So, BORPH: An operating system for FPGA-based reconfigurable computers, 2007, 133 pages.
Swanson, GreenDroid: Exploring the Next Evolution in Smartphone Application Processors, Apr. 2011, 8 pages.
Templin, Design of an adaptable run-time reconfigurable software-defined radio processing architecture, 2010, 62 pages.
Valero, 3D FPGA Resource Management and Fragmentation Metric for Hardware Multitasking, 2009, 7 pages.
Walder, Online Scheduling for Block-partitioned Reconfigurable Devices, 2003, 6 pages.
Wikipedia, Fifteen puzzle, Oct. 19, 2012, 3 pages.
Wikipedia, A* search algorithm, Oct. 19, 2012, 9 pages.
Xilinx, Partial Reconfiguration User Guide, May 3, 2010, 126 pages.
Xilinx, High Performance Computing Using FPGAs, Sep. 10, 2010, 15 pages.

* cited by examiner

DYNAMIC RECONFIGURATION OF PROGRAMMABLE HARDWARE

CROSS-REFERENCE TO RELATED APPLICATION

This is a U.S. national stage application filing under 35 U.S.C. §371 of international application PCT/US13/23891, entitled "DYNAMIC RECONFIGURATION OF PROGRAMMABLE HARDWARE", filed on Jan. 30, 2013, which is incorporated by reference herein in its entirety.

BACKGROUND

Unless otherwise indicated herein, the materials described in this section are not prior art to the claims in this application and are not admitted to be prior art by inclusion in this section.

The use of programmable hardware, such as Field Programmable Gate Arrays (FPGAs), can yield substantial benefits in energy efficiency and processing speed in computing devices. FPGAs can be programmed with coprocessors that specialize in executing certain types of operations, for example video decoding operations and encryption/decryption operations, among others. Coprocessors can often process their specialized operations more efficiently than general purpose processors. Computer systems may be adapted to use coprocessors to process the specialized operations for which they are programmed, while other computing tasks may be processed by general purpose processors such as processors in a computer's Central Processing Unit (CPU).

Computer systems, and servers in data centers as one example, may implement virtualized environments in which multiple Virtual Machines (VMs) may run simultaneously while sharing the same hardware. In data centers, virtualization may be used to consolidate data center equipment, lower capital and operational expenses, and also reduce energy consumption. The multiple VMs may use multiple coprocessors, which may be loaded onto programmable hardware such as FPGAs. The programmable hardware may be implemented within, or otherwise accessible to, servers running the multiple VMs. The multiple coprocessors for the multiple VMs may share available FPGA space, and in some cases, the multiple VMs may compete for available FPGA space.

Coprocessors may be allocated to non-overlapping physical regions within an FPGA, and these regions may be of different shapes and sizes. As VMs and their associated coprocessors are loaded and unloaded, FPGA fragmentation can occur, leading to inefficient use of FPGA resources. FPGA fragmentation is similar in some respects to disk fragmentation which results from continual writing and deleting of files.

Another useful analogy for FPGA fragmentation is a factory that produces rectangular blocks of different sizes which are stored before shipping. There are a limited number of drawers in which the blocks can be placed. When a new block is produced, the factory chooses any available place in a drawer where the block fits. However, blocks don't leave the drawers in the same order they arrive. After many blocks have come and gone, the arrangement becomes inefficient with many pockets of unused space between the blocks.

Similar to the factory analogy, when a VM that uses a coprocessor is loaded on a server, some FPGA resource allocation techniques simply choose any FPGA region in which the coprocessor fits, and load the coprocessor in the chosen FPGA region. On the other hand, when a VM that uses a coprocessor is terminated, the FPGA region occupied by the corresponding terminated coprocessor becomes available. After many coprocessors have come and gone, the arrangement becomes inefficient with many regions of unused space between loaded coprocessors.

As a result of fragmentation, some coprocessors may be excluded from an FPGA that has sufficient resources for the excluded coprocessors. However, the available FPGA resources may be fragmented and cannot fit the excluded coprocessors without terminating other coprocessors. Excluded coprocessors may be swapped into an FPGA by terminating other coprocessors to make room in the FPGA. However, swapping coprocessors takes time, and results in coprocessor "down time" during the swap.

There is a need in the industry to more effectively leverage the benefits of programmable hardware. By way of example, there is a need to increase utilization of programmable hardware resources by reducing fragmentation, there is a need to reduce coprocessor down time due to swapping coprocessors into FPGAs to meet the coprocessor needs of different VMs, and there is a need to reduce fragmentation and reduce coprocessor down time in ways that present net performance gains in computing systems.

SUMMARY

The present disclosure generally describes technologies including devices, methods, and computer readable media relating to dynamic reconfiguration of programmable hardware. Some example methods may be directed to dynamically assigning coprocessor regions in programmable hardware such as an FPGA. Example methods may include executing a placement algorithm to determine at least one efficient arrangement of coprocessor regions within the FPGA, and executing a path finding algorithm to determine path finding operations from a starting arrangement of coprocessor regions to the efficient arrangement of coprocessor regions. The path finding operations may be performed to transition the FPGA from the starting arrangement of coprocessor regions to the efficient arrangement of coprocessor regions.

Each path finding operation may include, for example: establishing a reconfiguration region of the FPGA; disabling coprocessors having coprocessor regions in the reconfiguration region; assigning new coprocessor regions in the reconfiguration region; and/or loading coprocessors in each of the new coprocessor regions. Meanwhile, coprocessors may continue to operate during each path finding operation in coprocessor regions outside the reconfiguration region.

Some example systems may include a server configured to run multiple Virtual Machines (VMs), an FPGA, a configuration controller, a programmable hardware optimizer, and a hypervisor. Some example programmable hardware optimizers may be configured to determine an efficient arrangement of coprocessor regions within the FPGA, for example by executing a placement algorithm, and to determine a reconfiguration region of the FPGA to transition the FPGA from a starting arrangement of coprocessor regions to the efficient arrangement of coprocessor regions, for example by executing a path finding algorithm. In some embodiments, programmable hardware optimizers may be configured to make VM scheduling recommendations to the hypervisor for reduced execution time for VMs using coprocessors in the reconfiguration region, and to identify coprocessors and new coprocessor regions within the reconfiguration region to the configuration controller, to adapt the configuration controller to load the identified coprocessors in the new coprocessor regions when the hypervisor reduces execution time for the VMs using coprocessors in the reconfiguration region.

Some example configuration controllers may be adapted to provide a starting arrangement of coprocessor regions within the FPGA to the programmable hardware optimizer. The programmable hardware optimizer may execute its placement and path finding algorithms as summarized above. Example configuration controllers may be adapted to receive from the programmable hardware optimizer an identification of a reconfiguration region within the FPGA and identifications of coprocessors and new coprocessor regions to be loaded in the reconfiguration region. Example configuration controllers may be adapted to reconfigure the reconfiguration region, for example by loading the identified coprocessors in the new coprocessor regions within the reconfiguration region pursuant to the information received from the programmable hardware optimizer.

In some embodiments, configuration controllers may be configured to receive scheduling information, for example from the hypervisor. The scheduling information may indicate when to reconfigure the reconfiguration region, for example by indicating when coprocessors in the reconfiguration region have reduced activity due to reduced execution time for corresponding VMs. Example configuration controllers may be configured to load the identified coprocessors in the new coprocessor regions within the reconfiguration region during the time indicated in the scheduling information.

Some example hypervisors may be configured to receive VM scheduling recommendations for VMs that use coprocessors in a reconfiguration region within an FPGA. The VM scheduling recommendations may recommend scheduling VMs according to coprocessor availability during reconfiguration of the reconfiguration region, for example by reducing execution time of VMs during reconfiguration of the reconfiguration region. Hypervisors may be configured to schedule VMs according to the VM scheduling recommendations, for example by reducing execution time of VMs using coprocessors in the reconfiguration region, while allowing VMs that use coprocessors outside the reconfiguration region to have normal or increased execution time.

Example hypervisors may be configured to provide, for use by the configuration controller, scheduling information indicating when execution time is reduced for VMs that use coprocessors in the reconfiguration region. The scheduling information may be effective to adapt the configuration controller to reconfigure the reconfiguration region during a period when execution time is reduced for VMs that use coprocessors in the reconfiguration region.

Computing devices and computer readable media having instructions implementing the various technologies described herein are also disclosed. Example computer readable media may comprise non-transitory computer readable storage media having computer executable instructions executable by a processor, the instructions that, when executed by the processor, cause the processor to carry out any combination of the various methods provided herein. Example computing devices may include a server comprising a processor, a memory, and software and/or hardware components configured to carry out the methods described herein.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
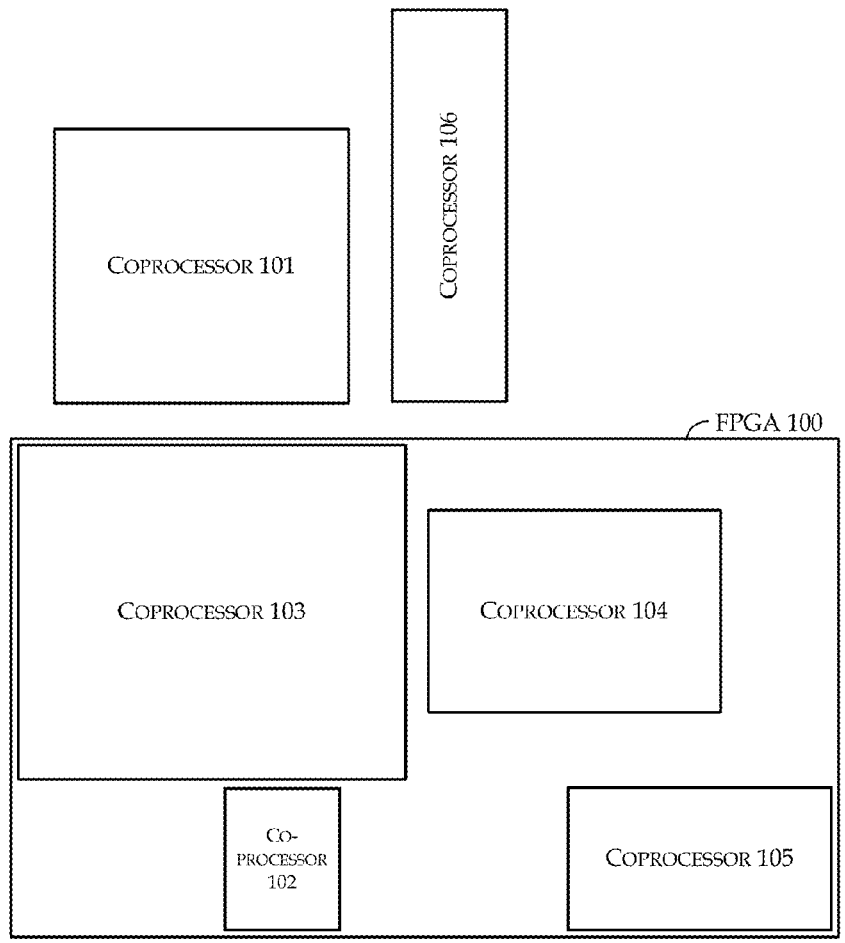
FIG. 1 is a diagram illustrating an example starting arrangement of coprocessors in an FPGA.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and made part of this disclosure.

The present disclosure is generally drawn, inter alia, to technologies including methods, devices, systems and/or computer readable media deployed therein relating to dynamic reconfiguration of programmable hardware. In some examples, coprocessor regions in programmable hardware such as an FPGA may be dynamically assigned to transition the FPGA from an initial or a starting arrangement (referred to herein as a "starting arrangement") of coprocessor regions to an efficient arrangement of coprocessor regions. A placement algorithm may be executed to determine the efficient arrangement of coprocessor regions, and a path finding algorithm may be executed to determine path finding operations leading from the starting arrangement to the efficient arrangement. The path finding operations may be performed to implement the transition.

The term "dynamically", as used herein in the context of dynamically assigning coprocessor regions in an FPGA, refers to assigning coprocessor regions in an FPGA while coprocessors loaded into other regions in the FPGA continue to run. Dynamically reconfigurable FPGAs allow "hot" switching, so that part of the FPGA can be reprogrammed while another part continues to run. Dynamically assigning coprocessor regions in an FPGA makes use of the dynamically reconfigurable capability, rather than for example shutting down an entire FPGA to reconfigure it.

In some embodiments, coprocessor regions in an FPGA may be dynamically assigned by executing a placement algorithm to determine an efficient arrangement of coprocessor regions within the FPGA, executing a path finding algorithm to determine path finding operations leading from a starting arrangement of coprocessor regions to the efficient arrangement, and performing path finding operations to transition the FPGA from the starting arrangement to the efficient arrangement. During each path finding operation, a reconfiguration region of the FPGA may be established such that coprocessors outside the reconfiguration region may continue to operate. FIG. 1-FIG. 6 illustrate an example dynamic assignment of coprocessor regions in an FPGA.

FIG. 1 is a diagram illustrating an example starting arrangement of coprocessors in an FPGA, arranged in accordance with at least some embodiments of the present disclosure. FIG. 1 includes an FPGA 100; coprocessors loaded in FPGA 100 including a coprocessor 102, a coprocessor 103, a coprocessor 104, and a coprocessor 105; and coprocessors not loaded in FPGA 100 including a coprocessor 101 and a coprocessor 106.

Six coprocessors are illustrated in FIG. 1, with four of the coprocessors loaded in FPGA 100. The number of coprocessors, dimensions of coprocessors, dimensions of FPGA 100, and arrangement of coprocessors in FPGA 100 is for the purpose of example, and it will be appreciated that more or fewer coprocessors, with any dimensions, may be arranged in FPGAs of any dimensions.

Figure 6:
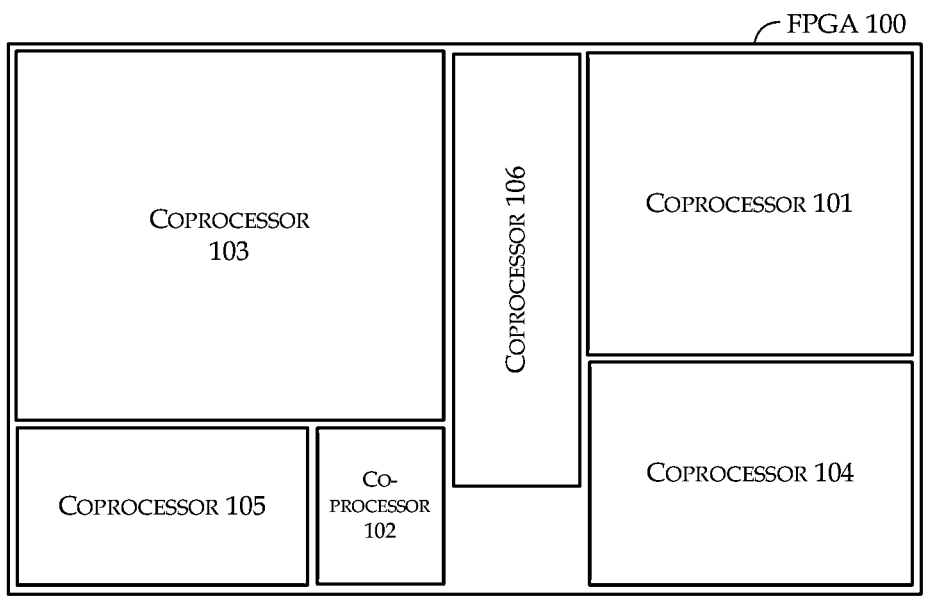
FIG. 6 is a diagram illustrating an example efficient arrangement of coprocessor regions in an FPGA.

In FIG. 1, each of coprocessors 102-105 occupies a coprocessor region in FPGA 100. Coprocessors 102-105 are part of the starting arrangement while coprocessors 101 and 106 are not. The starting arrangement of coprocessor regions illustrated in FIG. 1 may be less efficient than it could be. For example, the starting arrangement illustrated in FIG. 1 may be less efficient than the efficient arrangement illustrated in FIG. 6, because FIG. 1 uses a smaller percentage of available FPGA resources than FIG. 6. Due to the less efficient arrangement of the starting arrangement illustrated in FIG. 1, coprocessors 102-105 occupy positions in FIG. 1 that do not allow for also loading coprocessors 101 and 106 in FPGA 100, because FIG. 1 does not provide contiguous blocks of FPGA 100 of sufficiently large dimensions for coprocessors 101 and 106. Meanwhile, FPGA 100 has sufficient resources to simultaneously run coprocessors 101 and 106 as well as coprocessors 102-105, for example as illustrated in FIG. 6. Coprocessors 101 and 106 may be referred to herein as "desired coprocessors", because it may be desirable to run coprocessors 101 and 106 as well as coprocessors 102-105 in FPGA 100.

FIG. 1-FIG. 6 illustrate a simplified FPGA and coprocessors in which relatively few coprocessors are included in FPGA 100. It will be appreciated that FIG. 1-FIG. 6 are simplified for the purpose of simplicity of explanation, and that in some embodiments a larger number of coprocessors, e.g., hundreds of coprocessors or more, may be included in an FPGA, and that the technologies described herein may be applied to scenarios involving any size FPGA and any number of coprocessors. Furthermore, FIG. 1-FIG. 6 illustrate a 2 Dimensional (2D) FPGA. In some embodiments, an FPGA may be 3 Dimensional (3D), e.g., by including multiple layers in which coprocessors may optionally occupy 3D regions. The technologies described herein may be applied to 2D as well as 3D FPGA embodiments.

Figure 2:
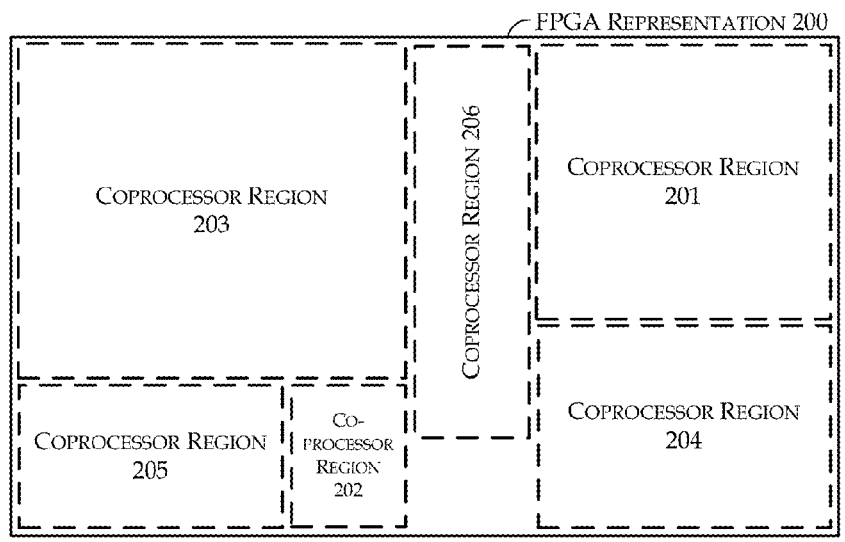
FIG. 2 is a diagram illustrating an example efficient arrangement of coprocessor regions in an FPGA.

FIG. 2 is a diagram illustrating an example efficient arrangement of coprocessor regions in an FPGA, arranged in accordance with at least some embodiments of the present disclosure. FIG. 2 includes an FPGA representation 200 and coprocessor regions including a coprocessor region 201, a coprocessor region 202, a coprocessor region 203, a coprocessor region 204, a coprocessor region 205, and a coprocessor region 206.

In FIG. 2, FPGA representation 200 is adapted with dimensions corresponding to dimensions of FPGA 100. Coprocessor region 201 is adapted with dimensions corresponding to dimensions of coprocessor 101. Coprocessor region 202 is adapted with dimensions corresponding to dimensions of coprocessor 102. Coprocessor region 203 is adapted with dimensions corresponding to dimensions of coprocessor 103. Coprocessor region 204 is adapted with dimensions corresponding to dimensions of coprocessor 104. Coprocessor region 205 is adapted with dimensions corresponding to dimensions of coprocessor 105. Coprocessor region 206 is adapted with dimensions corresponding to dimensions of coprocessor 106. Coprocessor regions 201-206 are arranged within FPGA representation 200 in an efficient arrangement which is more efficient than the starting arrangement illustrated in FIG. 1, e.g., by using more FPGA resources than the starting arrangement illustrated in FIG. 1. As a result of the efficient arrangement, coprocessor regions 202-205 occupy positions within FPGA representation 200 that leave contiguous blocks of FPGA representation 200 of sufficiently large dimensions for coprocessor regions 201 and 206. The efficient arrangement illustrated in FIG. 2 uses a larger percentage of available FPGA resources than the starting arrangement of FIG. 1.

In some embodiments, a placement algorithm may be executed to determine an efficient arrangement of coprocessor regions within an FPGA, as illustrated in FIG. 2. Example placement algorithms may use dimensions of coprocessor regions 201-206, and dimensions of FPGA representation 200 as inputs, and may produce one or more efficient arrangements of coprocessor regions 201-206 within FPGA representation 200 as outputs. Output efficient arrangements may or may not be the maximally efficient arrangement. Output efficient arrangements may comprise any arrangements of coprocessor regions that are at least more efficient than the starting arrangement, such as the arrangement illustrated in FIG. 1, for example by using more of an FPGA for coprocessor regions than is used by the starting arrangement.

Any placement algorithm known in the art or as may be developed in the future may be used. Example placement algorithms may comprise so-called "offline" and/or "online" placement algorithms, wherein offline algorithms generally arrange elements all at once, and online algorithms generally place elements one at a time. Example placement algorithms may comprise so-called bin packing algorithms, greedy algorithms, first fit algorithms, first-fit decreasing height algorithms, best fit decreasing algorithms, next-fit decreasing height algorithms, floor-ceiling algorithms, knapsack packing algorithms, BF algorithms, KAMER-BF decreasing algorithms, simulated annealing algorithms, low-temperature annealing algorithms, and/or zero-temperature annealing algorithms.

In some embodiments, a placement algorithm may comprise a Bottom Left (BL) algorithm and/or a genetic algorithm, for example as described in Jakobs, "On genetic algorithms for the packing of polygons", European Journal of Operational Research 88 (1996), pages 165-181. A BL algorithm may provide a way to place rectangular elements given a certain order of the rectangles. In accordance with this disclosure, the rectangular elements may comprise coprocessors for placement in a FPGA region. An example BL algorithm may be configured as follows:

Define permutation $\pi$:
$i_j$=index of rectangle $r_{ij}$
$\pi=(i_1, \ldots i_n)$
Perform BL algorithm:
1) Place $r_{\pi(1)}$ in left lower corner of board
2) Shift $r_{\pi(i)}$ alternately, beginning from the upper right corner of the board, as far as possible to the bottom and then as far as possible to the left.

Permuting the order of the rectangles gives $n!*2^n$ different possible combinations, which for 25 rectangles is greater than $10^{31}$.

A genetic algorithm may call the BL algorithm repeatedly, with the goal to find a BL sequence that packs the rectangles well. The genetic algorithm may use a "goodness" function (f), which may define, e.g., the remaining space above the rectangles after they are placed.

It will be appreciated that placement algorithms may be configured in a variety of ways. Some placement algorithms may produce better results than others, while some placement algorithms may be more computationally efficient than others. There may be tradeoffs between quality of results (e.g., the efficiency of output efficient arrangements) and computational efficiency, and embodiments may select any appropriate balance between these competing considerations.

In some embodiments, a placement algorithm may be applied to determine multiple different efficient arrangements of coprocessor regions within FPGA 100. Determining multiple different efficient arrangements of coprocessor regions within FPGA 100 allows for calculating multiple different sets of path finding operations, as discussed herein, and selection of an efficient arrangement and a corresponding set of path finding operations based on considerations such as VM scheduling priorities, as discussed herein.

Once an efficient arrangement of coprocessor regions within an FPGA is determined, such as the efficient arrangement illustrated in FIG. 2, embodiments may be configured to load coprocessors in the coprocessor regions to implement the efficient arrangement. Some approaches may disable the entire FPGA 100, including coprocessors 102-105 as illustrated in FIG. 1, and then load coprocessors 101-106 in the coprocessor regions illustrated in FIG. 2. Other approaches may determine one or more path finding operations which disable and reconfigure portions or "reconfiguration regions" of FPGA 100, while allowing coprocessors having coprocessor regions outside the reconfiguration regions to continue to operate, as described further herein.

FIG. 3-FIG. 6 provide two example path finding operations to transition FPGA 100 from the starting arrangement illustrated in FIG. 1 to the efficient arrangement illustrated in FIG. 6. In FIG. 6, coprocessors 101-106 may be loaded in FPGA 100 according to the efficient arrangement of coprocessor regions illustrated in FIG. 2. FIG. 3-FIG. 6 thus provide example path finding operations to transition FPGA 100 from a starting arrangement an efficient arrangement, wherein the efficient arrangement may be determined by a placement algorithm as described in connection with FIG. 2.

Figure 3:
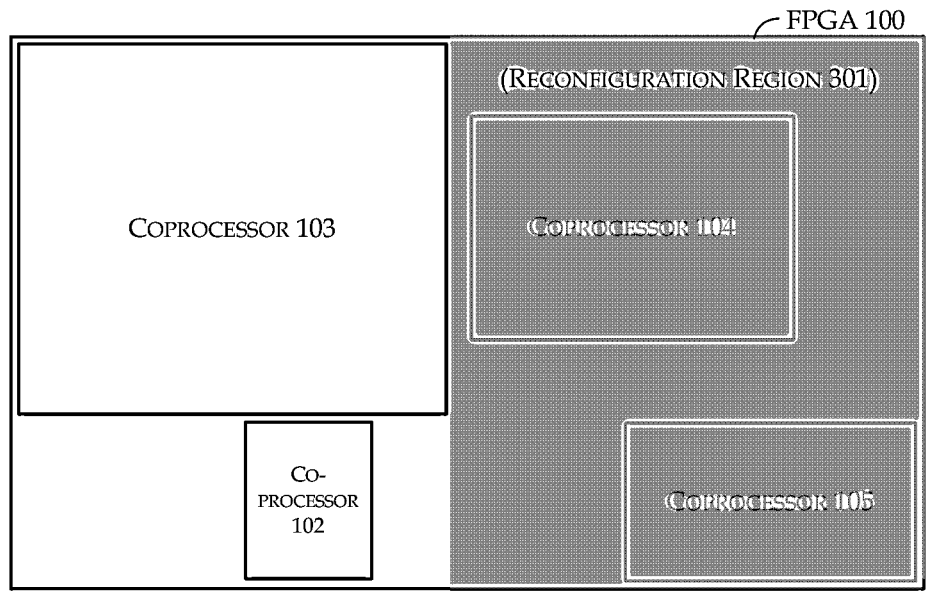
FIG. 3 is a diagram illustrating an example reconfiguration region which may be established in connection with a first path finding operation.
Figure 4:
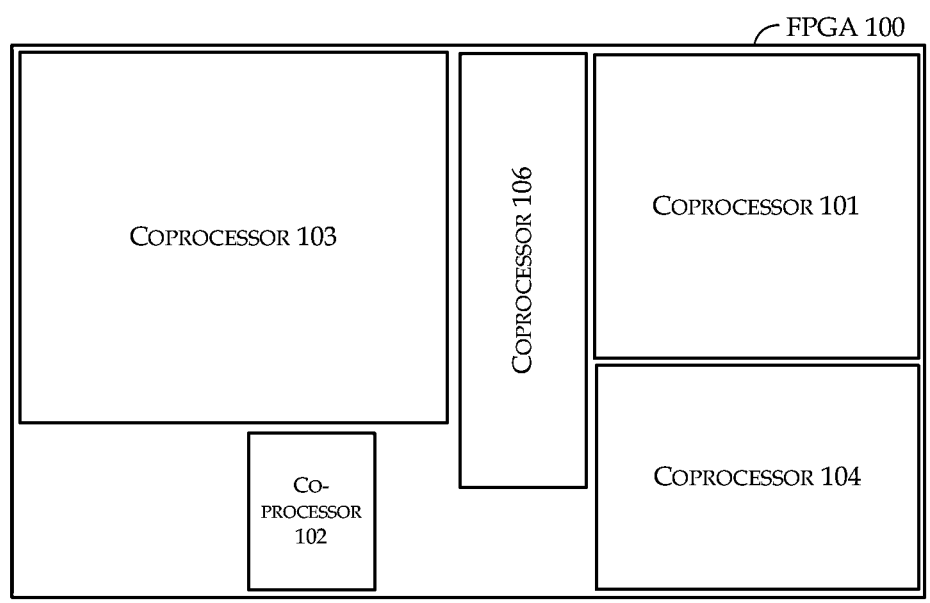
FIG. 4 is a diagram illustrating an example arrangement of coprocessors in an FPGA in which coprocessors are loaded into new coprocessor regions in the reconfiguration region illustrated in FIG. 3.
Figure 5:
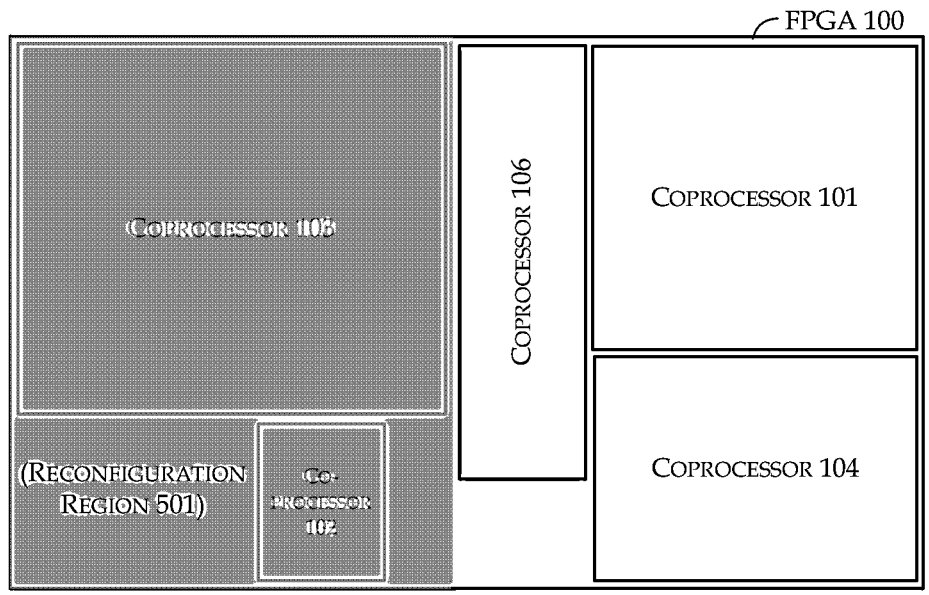
FIG. 5 is a diagram illustrating an example reconfiguration region which may be established in connection with a second path finding operation.

FIG. 3-FIG. 4 illustrate a first example path finding operation, and FIG. 5-FIG. 6 illustrate a second example path finding operation. The number of path finding operations, the dimensions and location of the reconfiguration regions used in the path finding operations, and the coprocessors loaded in the path finding operations are for the purpose of example and it will be appreciated that more or fewer path finding operations may be employed, path finding operations may use any dimensions and locations for reconfiguration regions, and path finding operations may load any coprocessors in reconfiguration regions.

FIG. 3 is a diagram illustrating an example reconfiguration region which may be established in connection with a first path finding operation, arranged in accordance with at least some embodiments of the present disclosure. FIG. 3 includes FPGA 100 and coprocessor 102, coprocessor 103, coprocessor 104, and coprocessor 105, wherein coprocessors 102-105 are in the starting arrangement illustrated in FIG. 1. FIG. 3 includes a reconfiguration region 301 indicated by a shaded region of FPGA 100. Coprocessors 104 and 105 are in reconfiguration region 301. Coprocessors 104 and 105 may be disabled pursuant to the methods described herein, while coprocessors 102 and 103 may be allowed to continue to operate.

FIG. 4 is a diagram illustrating an example arrangement of coprocessors in an FPGA in which coprocessors are loaded into new coprocessor regions in the reconfiguration region illustrated in FIG. 3, arranged in accordance with at least some embodiments of the present disclosure. FIG. 4 includes FPGA 100 and coprocessor 101, coprocessor 102, coprocessor 103, coprocessor 104, and coprocessor 106, wherein coprocessors 102-103 occupy the same coprocessor regions illustrated in FIG. 3, and coprocessors 101, 104, and 106 occupy new coprocessor regions in reconfiguration region 301 from FIG. 3.

FIG. 5 is a diagram illustrating an example reconfiguration region which may be established in connection with a second path finding operation, arranged in accordance with at least some embodiments of the present disclosure. FIG. 5 includes FPGA 100 and coprocessor 101, coprocessor 102, coprocessor 103, coprocessor 104, and coprocessor 106, wherein coprocessors 102-103 are in a reconfiguration region 501 indicated by a shaded region of FPGA 100, and coprocessors 101, 104, and 106 occupy coprocessor regions as illustrated in FIG. 4. Coprocessors 102-103 may be disabled in the second path finding operation, while coprocessors 101, 104, and 106 may be allowed to continue to operate.

FIG. 6 is a diagram illustrating an example efficient arrangement of coprocessor regions in an FPGA, arranged in accordance with at least some embodiments of the present disclosure. FIG. 6 includes FPGA 100 and coprocessors 101-106, wherein coprocessors 102, 103, and 105 occupy new coprocessor regions in reconfiguration region 501 from FIG. 5, and coprocessors 101, 104, and 106 occupy coprocessor regions as illustrated in FIG. 5.

In some embodiments, path finding operations such as illustrated in FIG. 3-FIG. 4 and FIG. 5-FIG. 6 may each comprise establishing a reconfiguration region of an FPGA, wherein at least one coprocessor region is outside the reconfiguration region, and wherein at least one coprocessor region is inside the reconfiguration region. For example, in the path finding operation illustrated in FIG. 3-FIG. 4, reconfiguration region 301 is established, and coprocessor regions for coprocessors 102 and 103 are outside reconfiguration region 301, while coprocessor regions for coprocessors 104 and 105 are inside reconfiguration region 301. In the path finding operation illustrated in FIG. 5-FIG. 6, reconfiguration region 501 is established, and coprocessor regions for coprocessors 101, 104, and 106 are outside reconfiguration region 501, while coprocessor regions for coprocessors 102 and 103 are inside reconfiguration region 501.

In some embodiments, path finding operations such as illustrated in FIG. 3-FIG. 4 and FIG. 5-FIG. 6 may each comprise disabling coprocessors having coprocessor regions in a reconfiguration region while allowing coprocessors having coprocessor regions outside the reconfiguration region to continue to operate. For example, in the path finding operation illustrated in FIG. 3-FIG. 4, coprocessors 104 and 105 having coprocessor regions in reconfiguration region 301 may be disabled at FIG. 3 while coprocessors 102 and 103 having coprocessor regions outside reconfiguration region 301 may be allowed to continue to operate. In the path finding operation illustrated in FIG. 5-FIG. 6, coprocessors 102 and 103 having coprocessor regions in reconfiguration region 501 may be disabled at FIG. 5 while coprocessors 101, 104, and 106 having coprocessor regions outside reconfiguration region 501 may be allowed to continue to operate.

In some embodiments, path finding operations such as illustrated in FIG. 3-FIG. 4 and FIG. 5-FIG. 6 may each comprise assigning one or more new coprocessor regions in a reconfiguration region. For example, in the path finding operation illustrated in FIG. 3-FIG. 4, new coprocessor regions 201, 204, and 206 from FIG. 2 may be assigned in reconfiguration region 301. In the path finding operation illustrated in FIG. 5-FIG. 6, new coprocessor regions 202, 203, and 205 from FIG. 2 may be assigned in reconfiguration region 501. In some embodiments, the assigned new coprocessor regions may match coprocessor regions from the target efficient arrangement, as illustrated in FIG. 3-FIG. 4 and FIG. 5-FIG. 6. In some embodiments, one or more intermediate arrangements of coprocessors in an FPGA may be used in the course of transitioning the FPGA to an efficient arrangement, and the assigned new coprocessor regions may match coprocessor regions from such an intermediate arrangement.

In some embodiments, path finding operations such as illustrated in FIG. 3-FIG. 4 and FIG. 5-FIG. 6 may each comprise loading coprocessors in each of the new coprocessor regions. For example, in the path finding operation illustrated in FIG. 3-FIG. 4, coprocessors 101, 104, and 106 may be loaded in coprocessor regions 201, 204, and 206 from FIG. 2. In the path finding operation illustrated in FIG. 5-FIG. 6, coprocessors 102, 103, and 104 may be loaded in coprocessor regions 202, 203, and 205 from FIG. 2.

In some embodiments, information for path finding operations such as illustrated in FIG. 3-FIG. 4 and FIG. 5-FIG. 6 may be determined by executing a path finding algorithm. For example, a path finding algorithm may be used to determine one or more path finding operations by determining location and dimensions of a reconfiguration region for each path finding operation, for use in establishing the reconfiguration region and disabling the coprocessors therein while allowing at least one coprocessor to continue to operate during each path finding operation. The path finding algorithm may determine location and dimensions of new coprocessor regions for each path finding operation, for use in assigning the new coprocessor regions and loading coprocessors therein. Once path finding operations are determined with a path finding algorithm, path finding operations may be performed to transition an FPGA from a starting arrangement to an efficient arrangement.

Example path finding algorithms may use a starting arrangement of coprocessor regions and an efficient arrangement of coprocessor regions as inputs, and may produce an output comprising one or path finding operations to transition an FPGA from the starting arrangement to the efficient arrangement. Multiple solutions comprising different path finding operations may be effective to transition an FPGA from a starting arrangement to an efficient arrangement. Path finding algorithms may determine any effective solution, and in some embodiments, path finding algorithms may determine multiple effective solutions.

Solutions determined by path finding algorithms may or may not be "optimal" transition strategies, e.g., strategies that employ the fewest possible path finding operations, or strategies that disable the fewest possible coprocessors in the course of transitioning an FPGA. As with placement algorithms described above, an appropriate balance between quality of results produced by path finding algorithms and computational efficiency of path finding algorithms may be adjusted as desired for particular embodiments.

Any path finding algorithm known in the art or as may be developed in the future may be used. Example path finding algorithms may include best fit search algorithms, A* algorithms, B* algorithms, beam search algorithms, and/or Dijkstra's algorithms. An example algorithm for use with some embodiments is described in connection with FIG. 14. It will be appreciated that path finding algorithms may be configured in a variety of ways. The problem of determining path finding operations is similar in some respects to sliding tile puzzles. An example sliding tile puzzle may have 15 sliding tiles, each with a different number from 1-15. The tiles may be arranged in four rows and four columns for a total of 16 possible tile positions. One of the tile positions is therefore open and any adjacent tile can be moved into the open position. The goal of the puzzle is to arrange the tiles in order, for example with tiles 1-4 on the first row, tiles 5-8 on the second row, tiles 9-12 on the third row, and tiles 13-15 on the fourth row. A variety of algorithms exist for solving puzzles such as sliding tile puzzles, and such algorithms may be adapted for use in path finding algorithms in some embodiments.

In some embodiments, path finding algorithms may be applied to determine multiple different solutions, each solution comprising one or more different path finding operations and/or different sequences of path finding operations. Furthermore, path finding algorithms may be applied to determine multiple different solutions for each of multiple different efficient arrangements determined by a placement algorithm. Determining multiple different solutions allows for selection of a solution based on considerations such as VM scheduling priorities, as discussed herein.

Figure 7:
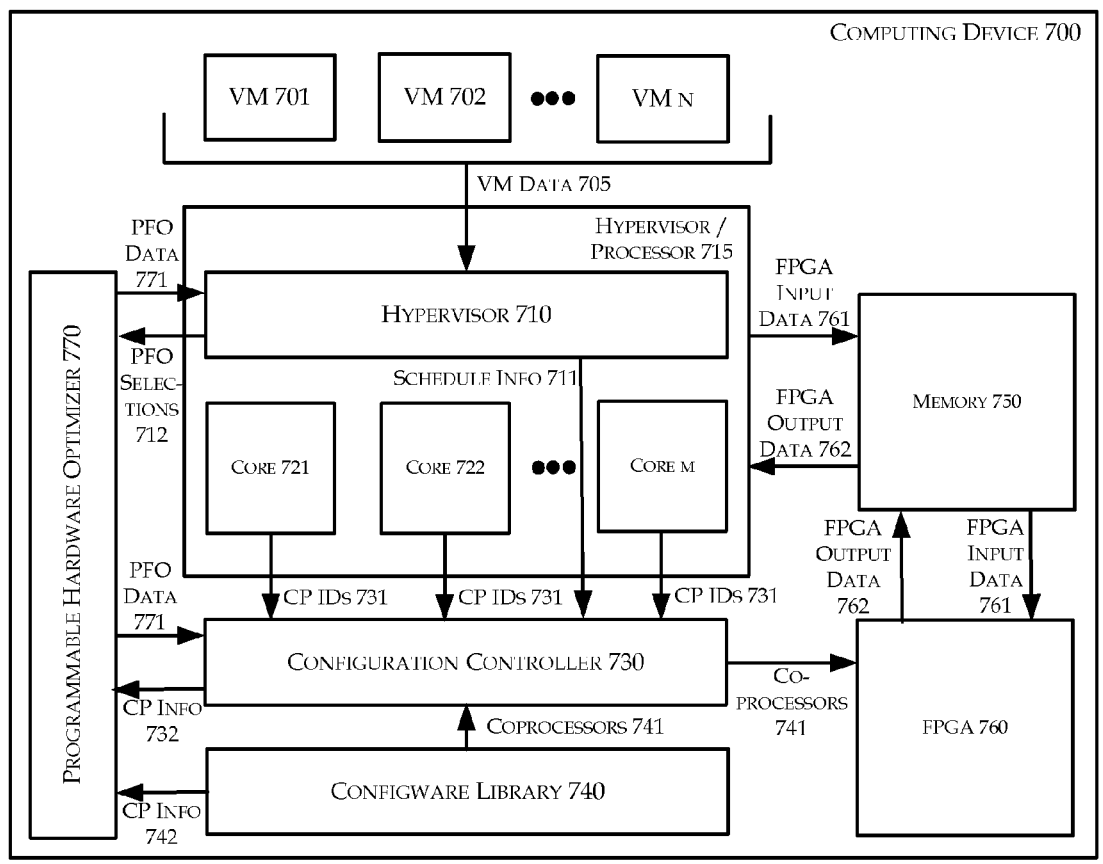
FIG. 7 is a block diagram illustrating an example computing device configured for dynamic reconfiguration of programmable hardware.

In some embodiments, dynamic assignment of coprocessor regions in an FPGA, as illustrated in connection with FIG. 1-FIG. 6, may be implemented in a computing device as illustrated in FIG. 7. Furthermore, dynamic assignment of coprocessor regions in an FPGA may be coordinated with VM scheduling in some embodiments, for example by scheduling VMs that use coprocessors according to coprocessor availability during performance of path finding operations. VMs using coprocessors that are disabled during a path finding operation may be provided with reduced execution time or in some cases with substantially no execution time during the path finding operation.

In some embodiments, scheduling VMs may comprise making VM scheduling recommendations to a hypervisor.

The scheduling recommendations may be effective to configure the hypervisor to perform VM scheduling according to coprocessor availability during performance of path finding operations. In some embodiments, multiple VM scheduling recommendations may be made to a hypervisor, the multiple VM scheduling recommendations corresponding to multiple path finding operation options. The hypervisor may select a VM scheduling recommendation from among the multiple VM scheduling recommendations, and the hypervisor may perform a path finding operation option corresponding to the hypervisor selected VM scheduling recommendation.

In some embodiments, multiple path finding operation options may be determined, e.g., for the purpose of making multiple VM scheduling recommendations to the hypervisor. The multiple path finding operation options may correspond to multiple efficient arrangements of coprocessor regions within the FPGA, which may be determined by a placement algorithm as described herein. In some embodiments, the multiple path finding operation options may correspond to different path finding solutions, the different path finding solutions corresponding to a single efficient arrangement, as described herein. Multiple path finding operation options may comprise, for example, establishing different reconfiguration regions of the FPGA and disabling different coprocessors.

In some embodiments, path finding operation data, such as configware identifiers for coprocessors to be loaded in an FPGA and new coprocessor regions in which to load the coprocessors, may be provided to a configuration controller. The path finding operation data may be effective to adapt the configuration controller to load identified coprocessors, e.g., as identified by the configware identifiers, in each new coprocessor region in a path finding operation.

FIG. 7 is a block diagram illustrating an example computing device configured for dynamic reconfiguration of programmable hardware, arranged in accordance with at least some embodiments of the present disclosure. FIG. 7 includes a computing device 700 which may comprise, e.g., a server configured to run multiple VMs. Computing device 700 includes VMs 701, 702, . . . n, a hypervisor/processor 715, a configuration controller 730, a configware library 740, a memory 750, an FPGA 760, and a programmable hardware optimizer 770. VMs 701, 702, . . . n, may include any number of VMs. Hypervisor/processor 715 includes a hypervisor 710 and processing cores 721, 722, . . . m. Processing cores 721, 722, . . . m may include any number of cores.

In FIG. 7, hypervisor 710 may be configured to schedule execution of VMs 701, 702, . . . n by processing cores 721, 722 . . . m. Hypervisor 710 may for example perform context switches to switch between different VMs. Hypervisor 710 may load VM data 705, such as VM state information for one or more of the illustrated VMs, for execution by one or more of the illustrated cores.

Coprocessors may be loaded into FPGA 760 to process operations on behalf of any of VMs 701, 702, . . . n. To load a coprocessor, any of cores 721, 722, . . . m may for example provide coprocessor IDs 731 to configuration controller 730. Configuration controller 730 may be adapted to retrieve coprocessors 741 corresponding to coprocessor IDs 731 from configware library 740. Configuration controller 730 may be adapted to load coprocessors 741 into FPGA 760.

In connection with executing VMs, hypervisor/processor 715, configured with VM data 705, may use coprocessors for example by placing FPGA input data 761 in memory 750 for processing of FPGA input data 761 by coprocessors loaded in FPGA 760, e.g., by coprocessors 741. FPGA 760 and/or coprocessors loaded therein may be adapted to process FPGA input data 761 and to produce FPGA output data 762. FPGA 760 and/or coprocessors loaded therein may place FPGA output data 762 in memory 750. FPGA output data 762 may be retrieved by hypervisor/processor 715 and/or by VMs executing therein, and FPGA output data 762 may be stored, used, displayed, further processed, etc., e.g., by VMs for which FPGA output data 762 is produced.

In some embodiments, configuration controller 730 may be adapted to provide coprocessor information 732 to programmable hardware optimizer 770. Coprocessor information 732 may comprise, for example, coprocessor IDs 731 for coprocessors that have been requested by cores 721, 722, . . . m. In some embodiments, coprocessor information 732 may comprise a starting arrangement of coprocessor regions within FPGA 760, including for example dimensions of FPGA 760, identifications of coprocessors, such as coprocessors 741, which may be loaded in FPGA 760, dimensions of any other coprocessors loaded in FPGA 760, and/or locations within FPGA 760 of coprocessors loaded in FPGA 760.

In some embodiments, programmable hardware optimizer 770 may be adapted to supplement coprocessor information 732 received from configuration controller 730 with coprocessor information 742 from configware library 740. For example, programmable hardware optimizer 770 may be adapted to retrieve coprocessor information 742 comprising dimensions of coprocessors identified by coprocessor IDs 731 from configware library 740, in the event that coprocessor dimension information is not available in coprocessor information 732 received from configuration controller 730.

In some embodiments, programmable hardware optimizer 770 may be adapted to determine at least one efficient arrangement of a plurality of coprocessor regions within FPGA 760, and to determine at least one path finding operation to transition FPGA 760 from its starting arrangement to the at least one efficient arrangement. Determining at least one efficient arrangement may comprise, for example, determining an arrangement of coprocessor regions in FPGA 760 which includes regions for coprocessors included in the starting arrangement, such as coprocessors 741, as well regions for one or more additional desired coprocessors. The additional desired coprocessors may comprise, for example, coprocessors which may be identified among coprocessor IDs 731, while not being included among coprocessors included in the starting arrangement, such as coprocessors 741.

Determining at least one path finding operation may comprise, e.g., determining at least one reconfiguration region of FPGA 760 for the path finding operation, wherein at least one coprocessor region is outside the reconfiguration region, and wherein at least one coprocessor region is inside the reconfiguration region, thereby allowing ongoing operation of coprocessors in regions outside the reconfiguration region during reconfiguration of the reconfiguration region. Determining at least one path finding operation may further comprise determining coprocessors to be loaded into the reconfiguration region and determining new coprocessor regions within the reconfiguration region into which the coprocessors may be loaded.

In some embodiments, programmable hardware optimizer 770 may be configured to execute placement algorithms and path finding algorithms as described herein, to generate path finding operation data 771, referred to in FIG. 7 as PFO data 771, effective to implement path finding operations in computing device 700. Example embodiments of programmable hardware optimizer 770 are described in further detail in connection with FIG. 8.

Programmable hardware optimizer 770 may be configured to provide path finding operation data 771 to configuration controller 730 to identify coprocessors and new coprocessor regions within reconfiguration regions to configuration controller 730. Path finding operation data 771 may adapt configuration controller 730 to load identified coprocessors in identified new coprocessor regions for each path finding operation included in path finding operation data 771.

In some embodiments, configuration controller 730 may be adapted to receive, from programmable hardware optimizer 770, path finding operation data 771 including, for example, identifications of reconfiguration regions within FPGA 760 and identifications of one or more coprocessors and one or more new coprocessor regions within the reconfiguration regions, as described above. Configuration controller 730 may be adapted to perform path finding operations according to received path finding operation data 771, for example by loading identified coprocessors in identified new coprocessor regions within identified reconfiguration regions pursuant to each path finding operation included in path finding operation data 771.

In some embodiments, configuration controller 730 may be adapted to load identified coprocessors in identified new coprocessor regions, as identified in path finding operation data 771, according to scheduling information 711 provided by hypervisor 710. Scheduling information 711 may indicate to configuration controller 730 when hypervisor 710 reduces execution time for VMs using coprocessors in reconfiguration regions, so that configuration controller 730 can disable coprocessors in reconfiguration regions with reduced effect on VMs using the disabled coprocessors. Configuration controller 730 may for example receive scheduling information 711 indicating when coprocessors in reconfiguration regions have reduced activity due to reduced execution time for VMs using the coprocessors in the reconfiguration regions. Configuration controller 730 may be adapted to reconfigure reconfiguration regions during the period of reduced activity.

In some embodiments, programmable hardware optimizer 770 may be configured to provide path finding operation data 771 to hypervisor 710. Path finding operation data 771 provided to hypervisor 710 may be effective to make VM scheduling recommendations to hypervisor 710. VM scheduling recommendations may implicitly or explicitly recommend scheduling VMs according to coprocessor availability during reconfiguration of reconfiguration regions, by reducing execution time of affected VMs. For example, path finding operation data 771 may identify one or more coprocessors to be disabled in a path finding operation, and path finding operation data 771 may comprise an explicit or implicit recommendation to reduce execution time for any affected VMs that use the disabled coprocessors.

Hypervisor 710 may be configured to receive VM scheduling recommendations, e.g., in the form of path finding operation data 771. Hypervisor 710 may be configured to schedule affected VMs according to the VM scheduling recommendations by reducing execution time of affected VMs while allowing VMs that use coprocessors in regions other than the reconfiguration region to have normal or increased execution time. Hypervisor 710 may be configured to provide, for use by configuration controller 730, scheduling information 711 indicating when execution time is reduced for affected VMs. Scheduling information 711 may be effective to adapt configuration controller 730 to reconfigure a corresponding reconfiguration region during a time when the execution time of affected VMs is reduced.

In some embodiments, programmable hardware optimizer 770 may be configured to explicitly or implicitly include, in path finding operation data 771 provided to hypervisor 110 and/or in scheduling recommendations otherwise provided to hypervisor 110, VM scheduling recommendations for reduced, substantially reduced, and/or substantially no execution time for VMs using coprocessors in reconfiguration regions during reconfiguration thereof. Reduced execution time may include any reduction in execution time. Substantially reduced execution time may comprise about a 50% or greater reduction in execution time. Substantially no execution time may comprise about a 95% or greater reduction in execution time. Reduced execution time, substantially reduced execution time, and substantially no execution time may be referred to collectively herein as reduced execution time.

Hypervisor 710 may be configured to follow received scheduling recommendations while optionally also accounting for other scheduling considerations and priorities. In some embodiments, reducing execution time by hypervisor 710 may comprise providing reduced, substantially reduced, or substantially no execution time to VMs during the time when the execution time is reduced. In some embodiments, hypervisor 710 may be configured to provide reduced, substantially reduced, or substantially no execution time to VMs according to received scheduling recommendations.

In some embodiments, programmable hardware optimizer 770 may be configured to determine multiple efficient arrangements of coprocessor regions within FPGA 760 and/or to determine multiple path finding solutions to transition FPGA 760 from a starting arrangement of coprocessor regions to any efficient arrangement of coprocessor regions. The multiple efficient arrangements and/or multiple path finding solutions may correspond to multiple path finding operation options. In some cases, path finding solutions may share one or more path finding operation options. Programmable hardware optimizer 770 may be configured to present multiple path finding operation options, optionally in the form of multiple VM scheduling recommendations, to hypervisor 710, for example to allow hypervisor 710 to select a path finding operation option that works best with other VM scheduling considerations.

For example, in some embodiments, path finding operation data 771 provided to hypervisor 710 may comprise multiple VM scheduling recommendations. The multiple VM scheduling recommendations may correspond to multiple reconfiguration region options effective to perform a path finding operation to transition or partially transition FPGA 760 from a starting arrangement of coprocessor regions to an efficient arrangement of coprocessor regions.

Hypervisor 710 may be configured to receive the multiple VM scheduling recommendations, and to select a VM scheduling recommendation from among the multiple VM scheduling recommendations. Hypervisor 710 may be configured to identify the selected VM scheduling recommendation to programmable hardware optimizer 770 and/or to configuration controller 730. In FIG. 7, hypervisor 710 is illustrated as identifying selected VM scheduling recommendations in the form of path finding operation selections 712 to programmable hardware optimizer 770. Programmable hardware optimizer 770 may then for example calculate a next set of VM scheduling recommendations, and provide the next set of VM scheduling recommendations to hypervisor 710 in the form of further path finding operation data 771.

In some embodiments, configuration controller 730 may be adapted to receive, from programmable hardware optimizer 770, multiple reconfiguration options. The multiple reconfiguration options may be included for example in path finding operation data 771 provided to configuration controller 730. Each reconfiguration option may correspond to a path finding operation option and may comprise an identified reconfiguration region, identifications of one or more coprocessors, and one or more new coprocessor regions within the identified reconfiguration region. Configuration controller 730 may be configured to receive a reconfiguration option selection—either from programmable hardware optimizer 770 or from hypervisor 710, and to perform a path finding operation according to the received selection. In some embodiments, scheduling information 711 may comprise an implicit or explicit reconfiguration option selection, and configuration controller 730 may perform a path finding operation selected by hypervisor 710 and according to a schedule as indicated in scheduling information 711.

Figure 8:
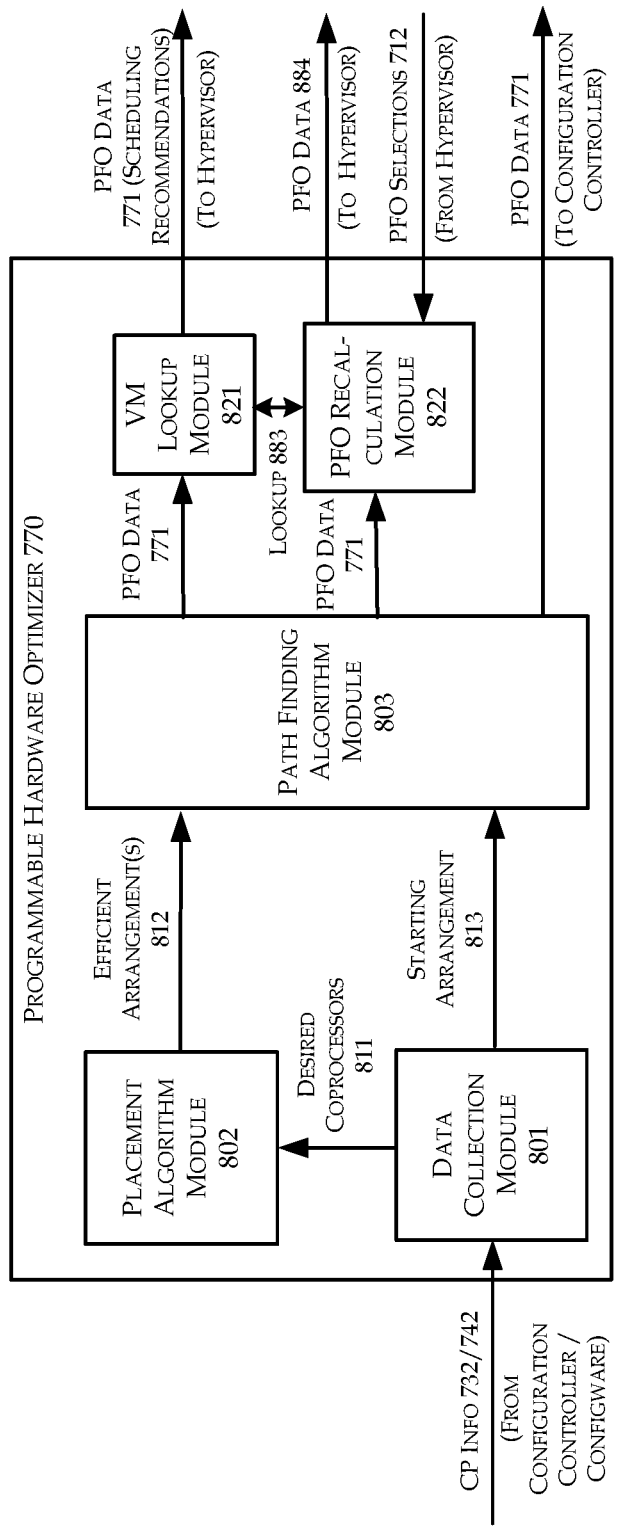
FIG. 8 is a block diagram illustrating an example programmable hardware optimizer.

FIG. 8 is a block diagram illustrating an example programmable hardware optimizer, arranged in accordance with at least some embodiments of the present disclosure. Programmable hardware optimizer 770 includes a data collection module 801, a placement algorithm module 802, a path finding algorithm module 803, a VM lookup module 821, and a path finding operation recalculation module 822.

In FIG. 8, data collection module 801 may be configured to receive coprocessor information 732/742 from a configuration controller and/or from a configware library as illustrated in FIG. 7. Data collection module 801 may be configured to determine desired coprocessors 811 for an FPGA, such as FPGA 760 in FIG. 7, and data collection module 801 may provide desired coprocessors 811 to placement algorithm module 802. Desired coprocessors 811 may comprise, for example, configware identifiers that identify coprocessors that would be beneficially included in FPGA 760. For example, desired coprocessors 811 may comprise identifiers of coprocessors 101-106 as illustrated in FIG. 1. In some embodiments, data collection module 801 may provide dimensions of desired coprocessors 811 as well as dimensions of FPGA 760 to placement algorithm module 802 along with desired coprocessors 811. In some embodiments, data collection module 801 may provide identifications of desired coprocessors 811 without dimension information to placement algorithm module 802, and placement algorithm module 802 may be configured to use pre-existing or otherwise acquired dimension information as input to its placement algorithm(s).

In some embodiments, data collection module 801 may be configured to provide starting arrangement 813 to path finding algorithm module 803. Starting arrangement 813 may for example include identifications of coprocessors loaded in FPGA 760, as well as locations of regions occupied by coprocessors loaded in FPGA 760. For example, in a starting arrangement such as illustrated in FIG. 1, starting arrangement 813 may include identifications of coprocessors 120, 103, 104, and 105, and coordinates of the regions occupied by coprocessors 120, 103, 104, and 105 within FPGA 100. Region coordinates may comprise, e.g., x and y axis coordinates for each corner of a coprocessor region. Where regions are rectangular, region coordinates may be condensed to x and y axis coordinates for any two diagonally opposite corners of a coprocessor region. For 3D FPGAs, region coordinates may comprise x, y, and z coordinates for coprocessor region corners. Any other technique for identifying coprocessor regions may be used as appropriate for particular embodiments.

In some embodiments, placement algorithm module 802 may be configured to execute a placement algorithm to determine efficient arrangement(s) 812 of desired coprocessors 811 in an FPGA, such as FPGA 760. The placement algorithm may comprise, e.g., a greedy algorithm, a first fit algorithm, a best fit decreasing algorithm, a first-fit decreasing algorithm, or any other placement algorithm. Placement algorithm module 802 may for example apply a placement algorithm using desired coprocessors 811 comprising representations of coprocessors 101-106, and a representation of FPGA 100, to determine at least one efficient arrangement 812, such as the efficient arrangement illustrated in FIG. 2. Placement algorithm module 802 may be configured to produce any output efficient arrangement(s) 812 using any of a variety of techniques as will be appreciated by those of skill in the art with the benefit of this disclosure. In some embodiments, placement algorithm module 802 may be configured to discard output coprocessor arrangements that are equally or less efficient than a current arrangement of coprocessors in an FPGA. In some embodiments, placement algorithm module 802 may be configured to produce multiple efficient arrangements 812. Placement algorithm module 802 may be configured to provide efficient arrangement(s) 812 to path finding algorithm module 803, e.g., by storing efficient arrangement(s) 812 in a memory location accessible by path finding algorithm module 803 and optionally notifying path finding algorithm module 803 of the availability of efficient arrangement(s) 812.

In some embodiments, path finding algorithm module 803 may be configured to execute a path finding algorithm to determine one or more path finding operations from a starting arrangement 813 of coprocessor regions to an efficient arrangement 812 of coprocessor regions. The path finding algorithm may comprise, e.g., a best fit search algorithm, an A* algorithm, a B* algorithm, a beam search algorithm, a Dijkstra's algorithm, or any other suitable path finding algorithm. Path finding algorithm module 803 may be configured to encode path finding operations in path finding operation data 771. Path finding algorithm module 803 may be configured to produce any path finding operations using any of a variety of techniques as will be appreciated by those of skill in the art with the benefit of this disclosure. In some embodiments, path finding algorithm module 803 may determine multiple solutions comprising different path finding operations effective to transition an FPGA from starting arrangement 813 to a single efficient arrangement among efficient arrangement(s) 812. In some embodiments, path finding algorithm module 803 may determine multiple solutions comprising different path finding operations effective to transition an FPGA from starting arrangement 813 to each of multiple different efficient arrangements 812.

Path finding operations produced by path finding algorithm module 803 may generally comprise establishing a reconfiguration region of an FPGA, wherein at least one coprocessor region is outside the reconfiguration region, and wherein at least one coprocessor region is inside the reconfiguration region; disabling coprocessors having coprocessor regions in the reconfiguration region while allowing coprocessors having coprocessor regions outside the reconfiguration region to continue to operate; assigning one or more new coprocessor regions in the reconfiguration region; and loading coprocessors in each of the new coprocessor regions. Path finding operation data 771 for each path finding operation may therefore comprise, for example, data identifying a reconfiguration region of an FPGA; data identifying coprocessors within the reconfiguration region to be disabled and/or data identifying coprocessors outside the reconfiguration region to be allowed to continue to operate; and/or data identifying new coprocessors and new coprocessor regions to be loaded in the reconfiguration region.

In some embodiments, path finding algorithm module 803 and/or programmable hardware optimizer 770 (which may be referred to collectively in this context as programmable hardware optimizer 770) may cause a computing device such as computing device 700 to perform the path finding operations described in path finding operation data 771 by providing path finding operation data 771 to an appropriately configured configuration controller, such as configuration controller 730. Configuration controller 730 may use path finding operation data 771 to transition an FPGA from starting arrangement 813 to efficient arrangement 812. Some embodiments may optionally furthermore make scheduling recommendations to a hypervisor, so that VM scheduling may be coordinated with path finding operations, as described below.

In some embodiments, programmable hardware optimizer 770 may make scheduling recommendations to a hypervisor, such as hypervisor 710, for example by providing path finding operation data 771 to hypervisor 710. In some embodiments, programmable hardware optimizer 770 may be configured to make multiple VM scheduling recommendations to hypervisor 710, wherein the multiple VM scheduling recommendations correspond to multiple reconfiguration region options effective to transition FPGA 760 from starting arrangement 813 of coprocessor regions to an efficient arrangement from efficient arrangements 812. For example, each of the multiple reconfiguration region options may correspond to a path finding operation from each of multiple path finding solutions produced by path finding algorithm module 803. VM lookup 821 and path finding operation recalculation 822 are optional additional elements which may also be included in some embodiments.

In embodiments without VM lookup 821 in programmable hardware optimizer 770, programmable hardware optimizer 770 may be configured to provide path finding operation data 771 to hypervisor 710 in substantially similar form as path finding operation data 771 is provided to the configuration controller. Hypervisor 710 may be configured to receive path finding operation data 771, identify a first path finding operation in path finding operation data 771, identify coprocessors to be disabled in the first path finding operation, and look up VMs that use the coprocessors to be disabled (affected VMs). Hypervisor 710 may be configured to then schedule affected VMs to provide reduced execution time to affected VMs, and/or notify configuration controller 730 with schedule information 711 to indicate when affected VMs are scheduled for reduced execution time, so that configuration controller 730 may perform the first path finding operation. Hypervisor 710 may then repeat the identification of a path finding operation, coprocessors, and VMs, as well as scheduling affected VMs and configuration controller notification, for any further path finding operations in path finding operation data 771.

In embodiments comprising VM lookup 821 in programmable hardware optimizer 770, VM lookup 821 may be configured to identify path finding operations in path finding operation data 771, identify coprocessors to be disabled in the path finding operations, and/or look up affected VMs for each path finding operation in path finding operation data 771. Programmable hardware optimizer 770 may provide scheduling recommendations to hypervisor 710 in the form of bundles of affected VMs, each bundle corresponding to a path finding operation. Such embodiments may reduce implementation complexity for hypervisor 710.

In some embodiments, path finding operation recalculation 822 may be included in programmable hardware optimizer 770 to select a next path finding operation for hypervisor 710. Path finding operation recalculation 822 may be included in programmable hardware optimizer 770, as illustrated in FIG. 8, or path finding operation recalculation 822 may be included in hypervisor 710. In some embodiments, path finding operation recalculation 822 may be omitted.

Path finding operation recalculation 822 may be included to address instances wherein path finding operation data 771 includes multiple path finding operation options for one or more of the path finding operations included therein. For example, when multiple efficient arrangements 812 are generated by placement algorithm module 802 and/or when multiple path finding solutions for efficient arrangements 812 are generated by path finding algorithm module 803, path finding operation data 771 may include multiple sets of path finding operations, each set of path finding operations corresponding to a path finding solution. In some cases, the multiple sets of path finding operations may share one or more path finding operations.

The multiple sets of path finding operations may be effective to present hypervisor 710 with multiple path finding operation options, e.g., hypervisor 710 may initially have one path finding operation option from each set of path finding operations included in path finding operation data 771. Making multiple options available may be beneficial in allowing hypervisor 710 to determine an option having a set of affected VMs that can more easily be simultaneously scheduled for reduced execution time. Hypervisor 710 may be configured to select a path finding operation and to return path finding operation selections 712 to path finding operation recalculation 822.

Path finding operation selections 712 may affect the available options for a next path finding operation. For example, when the sets of path finding operations in path finding operation data 771 do not comprise overlapping path finding operations, selection of a first path finding operation may commit hypervisor 710 to the remaining path finding operations in the set of path finding operations corresponding to hypervisor 710's initial selection. When the sets of path finding operations in path finding operation data 771 do comprise overlapping path finding operations, hypervisor 710 may continue to have multiple available options for second, third, and subsequent path finding operations. Path finding operation recalculation 822 may be configured to determine, based on path finding operation selections 712 and path finding operation data 771, updated path finding operation data 884 comprising available options for a next path finding operation, and to provide updated path finding operation data 884 to hypervisor 710. Path finding operation recalculation 822 may optionally be configured to engage VM lookup 821 with a lookup operation 883 to lookup affected VMs for updated path finding operation data 884 as described above.

Figure 9:
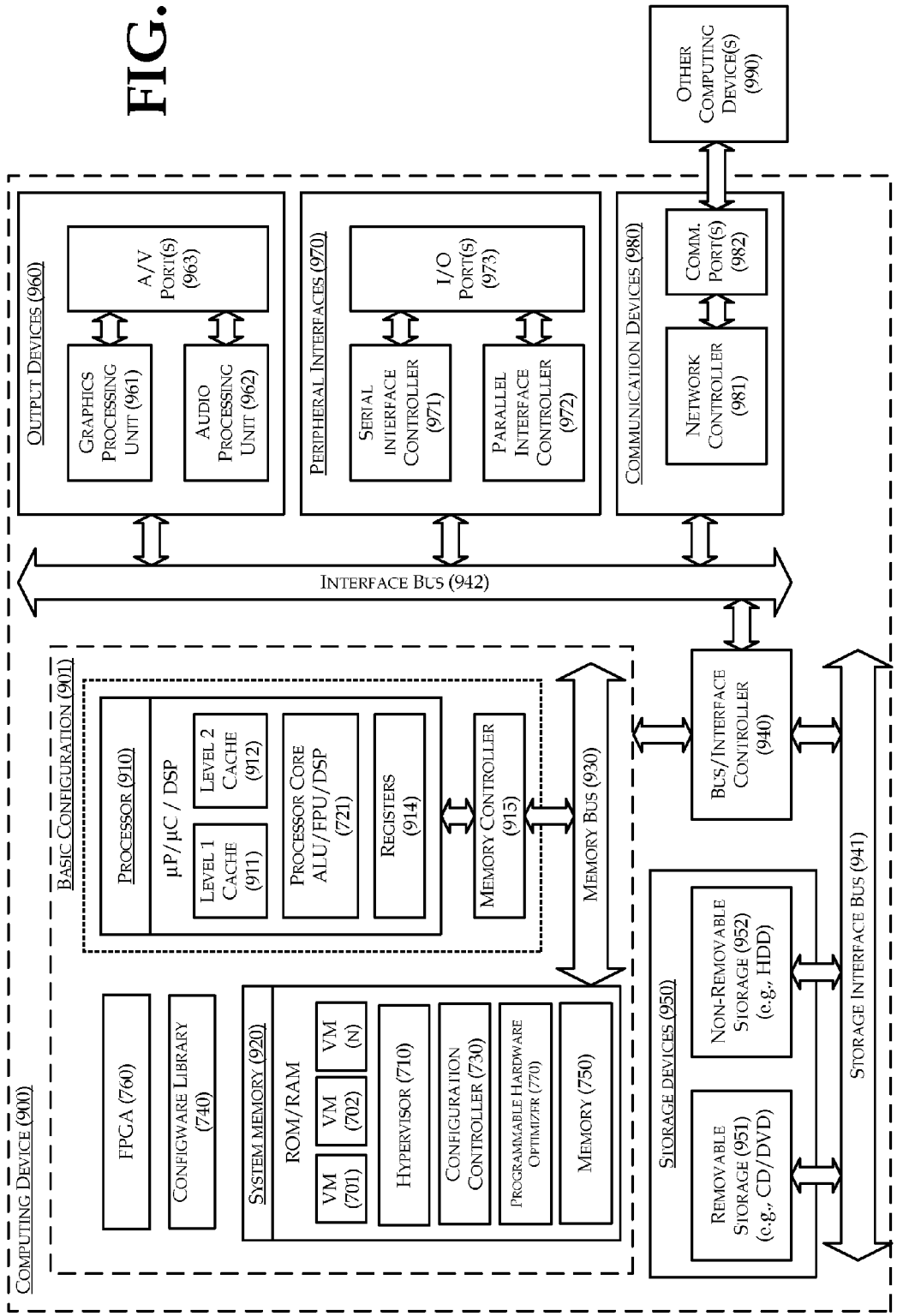
FIG. 9 is a block diagram of a computing device as another example of a computing device configured for dynamic reconfiguration of programmable hardware.

FIG. 9 is a block diagram of a computing device as another example of a computing device configured for dynamic reconfiguration of programmable hardware, arranged in accordance with at least some embodiments of the present disclosure. In a very basic configuration 901, computing device 900 may include one or more processors 910, FPGA 760, configware library 740, and system memory 920. A memory bus 930 may be used for communicating between the processor 910 and the system memory 920.

Depending on the desired configuration, processor 910 may be of any type including but not limited to a microprocessor (µP), a microcontroller (µC), a digital signal processor (DSP), or any combination thereof. Processor 910 may include one or more levels of caching, such as a level one cache 911 and a level two cache 912, one or more processor cores such as processor core 721, and registers 914. Processor core 721 may include an arithmetic logic unit (ALU), a floating point unit (FPU), a digital signal processing core (DSP Core), or any combination thereof. A memory controller 915 may also be used with the processor 910, or in some implementations the memory controller 915 may be an internal part of the processor 910.

Depending on the desired configuration, system memory 920 may be of any type including but not limited to volatile memory (such as RAM), non-volatile memory (such as ROM, flash memory, etc.), or any combination thereof. System memory 920 may include hypervisor 710 which may manage execution of VMs 701, 702 . . . n. System memory 920 may furthermore include configuration controller 730, programmable hardware optimizer 770, and memory 750. Memory 750 is illustrated in FIG. 9 as a portion of system memory 920, wherein memory 750 may be allocated for use with FPGA 760, however in some embodiments memory 750 may be physically separate from system memory 920.

Computing device 900 may have additional features or functionality, and additional interfaces to facilitate communications between the basic configuration 901 and any required devices and interfaces. For example, a bus/interface controller 940 may be used to facilitate communications between the basic configuration 901 and one or more data storage devices 950 via a storage interface bus 941. The data storage devices 950 may be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives, to name a few. Example computer storage media may include volatile and nonvolatile, removable and non-removable media implemented in any method or technology for storage of information, such as computer readable instructions, data structures, program modules, or other data.

Level 1 cache 911, level 2 cache 912, system memory 920, removable storage devices 951, and non-removable storage devices 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium that may be used to store the desired information and that may be accessed by computing device 900. Any such computer storage media may be part of computing device 900.

Computing device 900 may also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which may be configured to communicate to various external devices such as a display or speakers via one or more A/V ports 963. Example peripheral interfaces 970 may include a serial interface controller 971 or a parallel interface controller 972, which may be configured to communicate through either wired or wireless connections with external devices such as input devices (e.g., keyboard, mouse, pen, voice input device, touch input device, etc.) or other peripheral devices (e.g., printer, scanner, etc.) via one or more I/O ports 973. Other conventional I/O devices may be connected as well such as a mouse, keyboard, and so forth. An example communications device 980 includes a network controller 981, which may be arranged to facilitate communications with one or more other computing devices 990 over a network communication via one or more communication ports 982.

The computer storage media may be one example of a communication media. Communication media may typically be embodied by computer readable instructions, data structures, program modules, or other data in a modulated data signal, such as a carrier wave or other transport mechanism, and include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR), and other wireless media.

Computing device 900 may be implemented as a server in a data center. Computing device 900 may also be implemented as any device configured to use FPGA acceleration, such as a network server, an ecommerce server, or a personal or business use computer including both laptop computer and non-laptop computer configurations.

Figure 10:
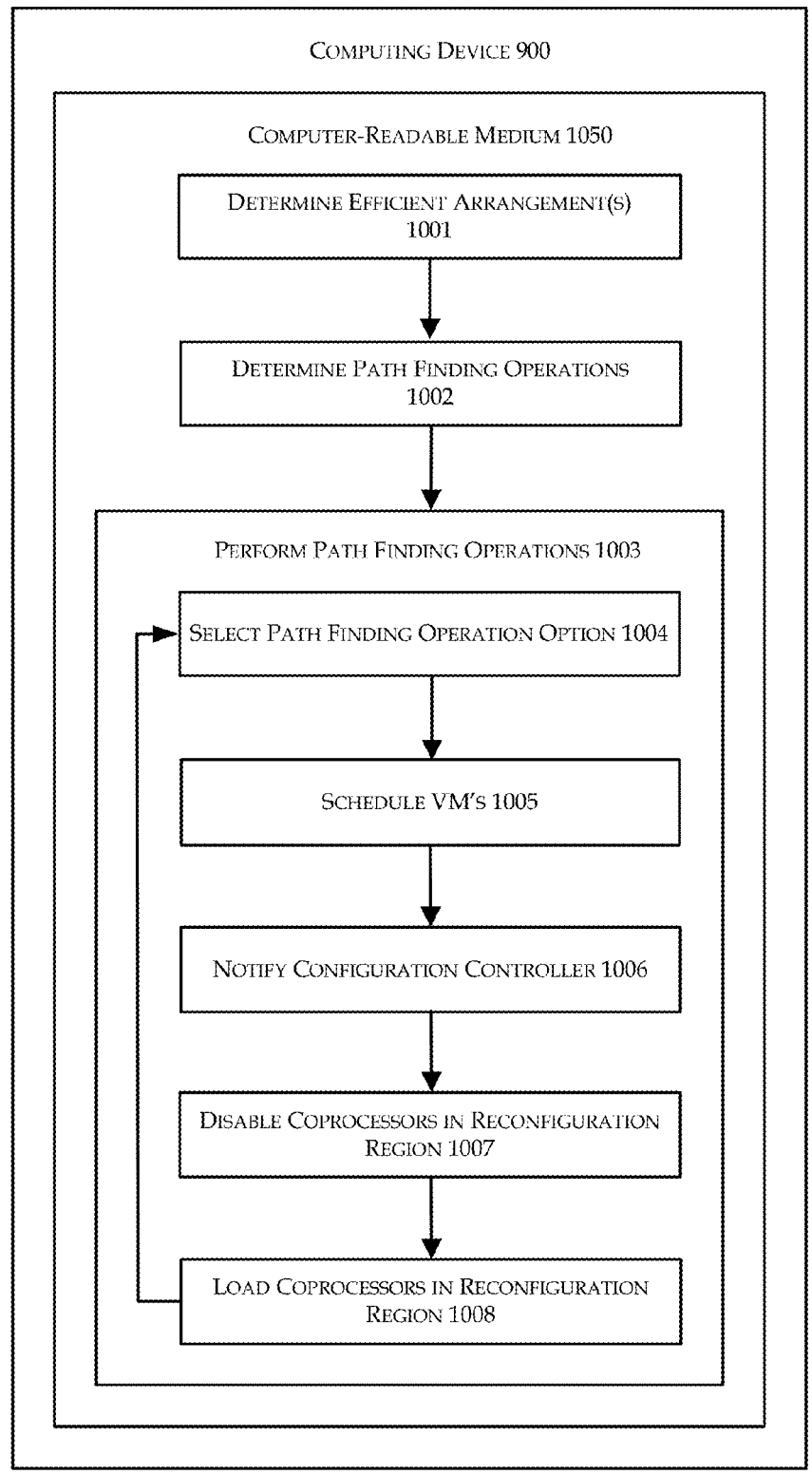
FIG. 10 is a flow diagram illustrating an example method for dynamically assigning coprocessor regions in an FPGA.

FIG. 10 is a flow diagram illustrating an example method for dynamically assigning coprocessor regions in an FPGA, arranged in accordance with at least some embodiments of the present disclosure. The example flow diagram may include one or more operations/modules as illustrated by blocks 1001-1008, which represent operations as may be performed in a method, functional modules in a computing device 900, and/or instructions as may be recorded on a computer readable medium 1050.

In FIG. 10, blocks 1001-1008 are illustrated as including blocks being performed sequentially, e.g., with block 1001 first and block 1003 last, wherein block 1003 comprises blocks 1004-1008. It will be appreciated however that these blocks may be re-arranged as convenient to suit particular embodiments and that these blocks or portions thereof may be performed concurrently in some embodiments. It will also be appreciated that in some examples various blocks may be eliminated, divided into additional blocks, and/or combined with other blocks.

FIG. 10 illustrates an example method by which computing device 900 may dynamically assign coprocessor regions in an FPGA to transition the FPGA from a starting arrangement of coprocessor regions to an efficient arrangement of coprocessor regions, while allowing one or more coprocessors in the FPGA to remain operational throughout the transition. In general, FIG. 10 includes determining an efficient arrangement and path finding operations effective to transition the FPGA to the efficient arrangement, and performing the path finding operations to transition the FPGA to the efficient arrangement. Furthermore, VMs may be scheduled for reduced execution time in a manner that is coordinated with the path finding operations.

At a "Determine Efficient Arrangements" block 1001, computing device 900 may execute a placement algorithm to determine an efficient arrangement of coprocessor regions within an FPGA. The placement algorithm may comprise, e.g., a greedy algorithm, a first fit algorithm, a best fit decreasing algorithm, and/or a first-fit decreasing algorithm. As noted herein, the efficient arrangement may be at least more efficient than the starting arrangement of coprocessor regions, by using more of the FPGA for coprocessor regions than is used by the starting arrangement of coprocessor regions. Block 1001 may be followed by block 1002.

At a "Determine Path Finding Operations" block 1002, computing device 900 may execute a path finding algorithm to determine path finding operations from the starting arrangement of coprocessor regions to the efficient arrangement. The path finding algorithm may comprise, e.g., a best fit search algorithm, an A* algorithm, a B* algorithm, a beam search algorithm, and/or a Dijkstra's algorithm. In some embodiments, path finding algorithm outputs may be supplemented by additional processing to "fill in" additional data describing path finding operations and/or to format path finding operation data for use by a configuration controller and/or a hypervisor.

Each path finding operation may comprise, for example: establishing a reconfiguration region of the FPGA, wherein at least one coprocessor region is outside the reconfiguration region, and wherein at least one coprocessor region is inside the reconfiguration region; disabling coprocessors having coprocessor regions in the reconfiguration region while allowing coprocessors having coprocessor regions outside the reconfiguration region to continue to operate; assigning one or more new coprocessor regions in the reconfiguration region; and/or loading coprocessors in each of the new coprocessor regions.

In some embodiments, computing device 900 may determine, at block 1002, a reconfiguration region, new coprocessors, and new coprocessor regions for each path finding operation. This information may be used at block 1003 to perform the path finding operations. Block 1002 may be followed by block 1003.

At a "Perform Path Finding Operations" block 1003, computing device 900 may perform the path finding operations determined at block 1002 to transition the FPGA from the starting arrangement to the efficient arrangement of coprocessor regions. Block 1003 may include blocks 1004-1008. In some embodiments, block 1003 may comprise performing blocks 1004-1008 for each path finding operation determined at block 1002. The arrow from block 1008 to block 1004 indicates return to block 1004 after completing a path finding operation, to perform a next path finding operation. Blocks 1004-1008 may be performed for successive path finding operations until an FPGA transition to an efficient arrangement is complete.

At a "Select Path Finding Operation Option" block 1004, in some embodiments computing device 900 may determine, at blocks 1001 and 1002, multiple sets of path finding operations, wherein the different sets present multiple different path finding operation options for a first, second, third, or subsequent path finding operation. For example, the placement algorithm may be applied at block 1001 to determine multiple efficient arrangements of coprocessor regions within the FPGA, and the multiple path finding operation options may correspond to the multiple efficient arrangements of coprocessor regions. In some embodiments, multiple path finding solutions may be determined at block 1002 for each of one or more single efficient arrangements determined at block 1001. Each path finding operation option may comprise establishing a different reconfiguration region of the FPGA, disabling different coprocessors, and/or loading different new coprocessors in different new coprocessor regions. Computing device 900 may select a path finding operation option from among the multiple path finding operation options.

In some embodiments, block 1004 may comprise making multiple VM scheduling recommendations to a hypervisor, wherein the multiple VM scheduling recommendations correspond to the multiple path finding operation options. The hypervisor may select a VM scheduling recommendation from among the multiple VM scheduling recommendations, and the hypervisor may perform a path finding operation option corresponding to the hypervisor selected VM scheduling recommendation. Block 1004 may be followed by block 1005.

In a "Schedule VM's" block 1005, computing device 900 may schedule VMs that use coprocessors within the FPGA according to coprocessor availability during performance of a selected path finding operation, so that VMs using coprocessors that are disabled during the path finding operation are provided with reduced execution time during the path finding operation. In some embodiments, the reduced execution time during the path finding operation may comprise substantially no execution time during the path finding operation. In some embodiments, scheduling VMs may comprise making VM scheduling recommendations, e.g., by a programmable hardware optimizer, to the hypervisor, wherein the VM scheduling recommendations may be effective to configure the hypervisor to perform the scheduling. Block 1005 may be followed by block 1006.

At a "Notify Configuration Controller" block 1006, computing device 900 may for example provide a reconfiguration region, new coprocessor regions therein, and configware identifiers for each new coprocessor region to a configuration controller, to adapt the configuration controller to load identified configware in each of the new coprocessor regions. In embodiments without VM scheduling cooperation such as provided by block 1005, the configuration controller may proceed directly to blocks 1007 and 1008. In embodiments with VM scheduling cooperation, the configuration controller may wait for a scheduled reduction in execution time for affected VMs, and the configuration controller may then proceed to blocks 1007 and 1008 during the scheduled reduction in execution time. Block 1006 may be followed by block 1007.

At a "Disable Coprocessors in Reconfiguration Region" block 1007, computing device 900 may disable coprocessors in a reconfiguration region including the new coprocessor regions identified in block 1006. In some embodiments, disabling coprocessors may comprise modifying FPGA processing to discontinue performing operations relating to the disabled coprocessors. Disabling may also include related management operations, e.g., to notify a VM or processing core using a disabled coprocessor that the coprocessor will be disabled and/or to return unprocessed data to the affected VM or processing core. Block 1007 may be followed by block 1008.

At a "Load Coprocessors in Reconfiguration Region" block 1008, computing device 900 may for example load coprocessors identified at block 1006 in each of the new coprocessor regions identified at block 1006. In some embodiments, existing configuration controller designs may be modified to support coprocessor region designations for coprocessors to be loaded in an FPGA. Coprocessor region designations for new coprocessor regions may be may be determined at block 1002, and may be provided to the configuration controller along with corresponding configware identifiers at block 1006. The configuration controller may then load identified coprocessors in designated coprocessor regions at block 1008. In some embodiments, groups of coprocessor identifiers may be provided to the configuration controller along with a new coprocessor region for the group, and the configuration controller may be allowed to automatically determine specific locations for coprocessors of the identified group within the new coprocessor region for the identified group.

Figure 11:
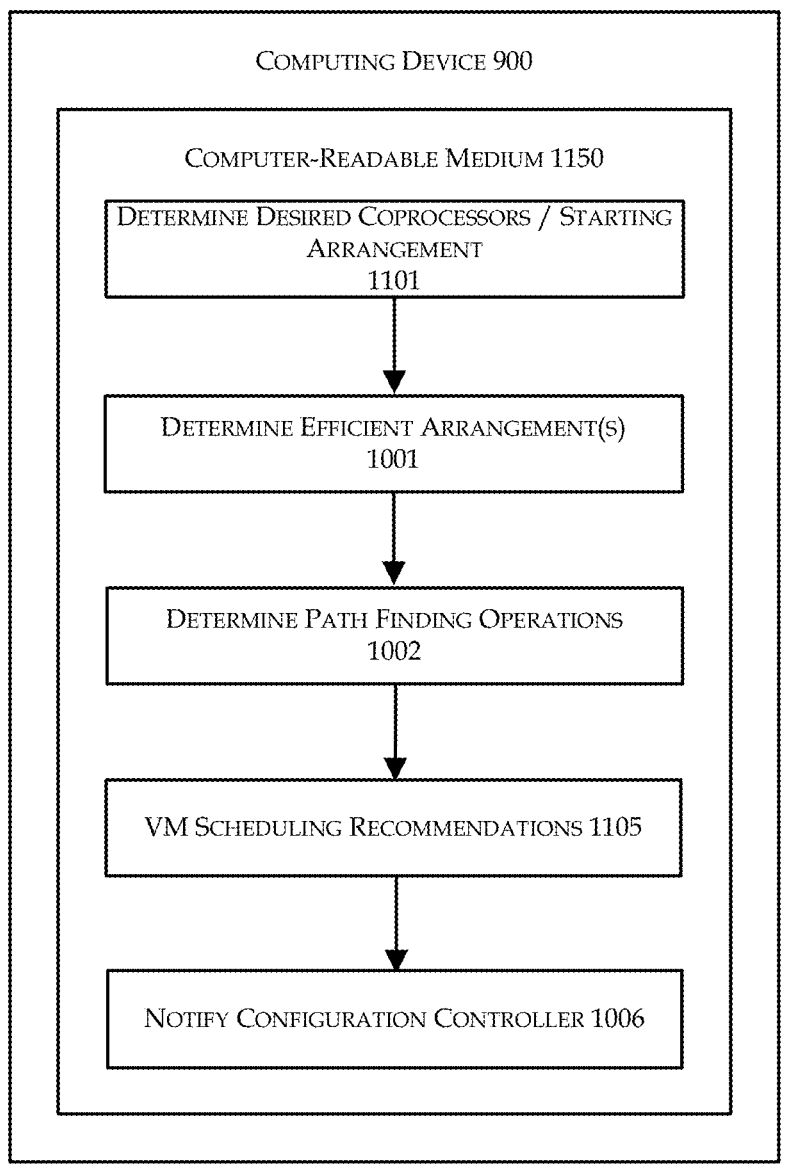
FIG. 11 is a flow diagram illustrating an example programmable hardware optimizer method.

FIG. 11 is a flow diagram illustrating an example programmable hardware optimizer method, arranged in accordance with at least some embodiments of the present disclosure. The example flow diagram may include one or more operations/modules as illustrated by blocks 1101, 1001, 1002, 1105, and 1006, which represent operations as may be performed in a method, functional modules in a computing device 900, and/or instructions as may be recorded on a computer readable medium 1150.

In FIG. 11, blocks 1101, 1001, 1002, 1105, and 1006 are illustrated as being performed sequentially, e.g., with block 1101 first and block 1006 last. It will be appreciated however that these blocks may be re-arranged as convenient to suit particular embodiments and that these blocks or portions thereof may be performed concurrently in some embodiments. It will also be appreciated that in some examples various blocks may be eliminated, divided into additional blocks, and/or combined with other blocks.

FIG. 11 illustrates an example method by which a programmable hardware optimizer in computing device 900 may participate in a method for dynamically assigning coprocessor regions in an FPGA such as illustrated in FIG. 10. FIG. 11 includes blocks 1001, 1002, and 1006 from FIG. 10, to indicate that the programmable hardware optimizer may perform these blocks of FIG. 10, along with blocks 1101 and 1105 as described below.

At a "Determine Desired Coprocessors/Starting Arrangement" block 1101, the programmable hardware optimizer may for example determine desired coprocessors for an FPGA, as well as a starting arrangement of coprocessors in the FPGA. The desired coprocessors may comprise coprocessors that would be used by VMs in computing device 900 if loaded into the FPGA. The desired coprocessors may be determined, for example, by requesting coprocessor information from a configuration controller and/or a hypervisor. The starting arrangement of coprocessors in the FPGA may likewise be determined by requesting coprocessor information from a configuration controller.

In some embodiments, desired coprocessors may be prioritized by their relative acceleration and/or energy efficiency benefits. When there are more desired coprocessors than can fit in the FPGA, a set of desired coprocessors comprising the highest priority coprocessors that can fit in the FPGA may be assembled. Block 1101 may be followed by blocks 1001 and 1002.

At a "Determine Efficient Arrangement(s)" block 1001 and a "Determine Path Finding Operations" block 1002, the programmable hardware optimizer may determine at least one efficient arrangement of coprocessor regions within an FPGA and determine path finding operations to transition the FPGA from the starting arrangement of coprocessor regions to the efficient arrangement of coprocessor regions, as discussed herein. Determining path finding operations may comprise, inter alia, determining at least one reconfiguration region of the FPGA for each path finding operation, wherein at least one coprocessor region is outside the reconfiguration region, and wherein at least one coprocessor region is inside the reconfiguration region, as discussed herein. Blocks 1001 and 1002 may comprise placement algorithms and/or path finding algorithms as discussed herein, and blocks 1001 and 1002 may determine multiple efficient arrangements and/or multiple path finding solutions as also described herein. Blocks 1001 and 1002 may be followed by block 1105.

At a "VM Scheduling Recommendations" block 1105, the programmable hardware optimizer may make one or more VM scheduling recommendations to a hypervisor for reduced execution time for VMs using coprocessors in a reconfiguration region for a path finding operation. In some embodiments, the VM scheduling recommendations to the hypervisor may comprise recommendations for substantially no execution time for VMs using coprocessors in the reconfiguration region during loading of affected coprocessors in new coprocessor regions within the reconfiguration region. In some embodiments, the programmable hardware optimizer may be configured to make multiple VM scheduling recommendations to the hypervisor, wherein the multiple VM scheduling recommendations correspond to multiple reconfiguration region options effective to transition the FPGA from the starting arrangement of coprocessor regions to the efficient arrangement of coprocessor regions. Block 1105 may be followed by block 1006.

At a "Notify Configuration Controller" block 1006, the programmable hardware optimizer may for example identify coprocessors and new coprocessor regions within one or more reconfiguration regions to a configuration controller, to adapt the configuration controller to load the identified coprocessors in the new coprocessor regions when the hypervisor reduces execution time for the VMs using coprocessors in the reconfiguration region. Block 1006 is also discussed above in connection with FIG. 10.

Figure 12:
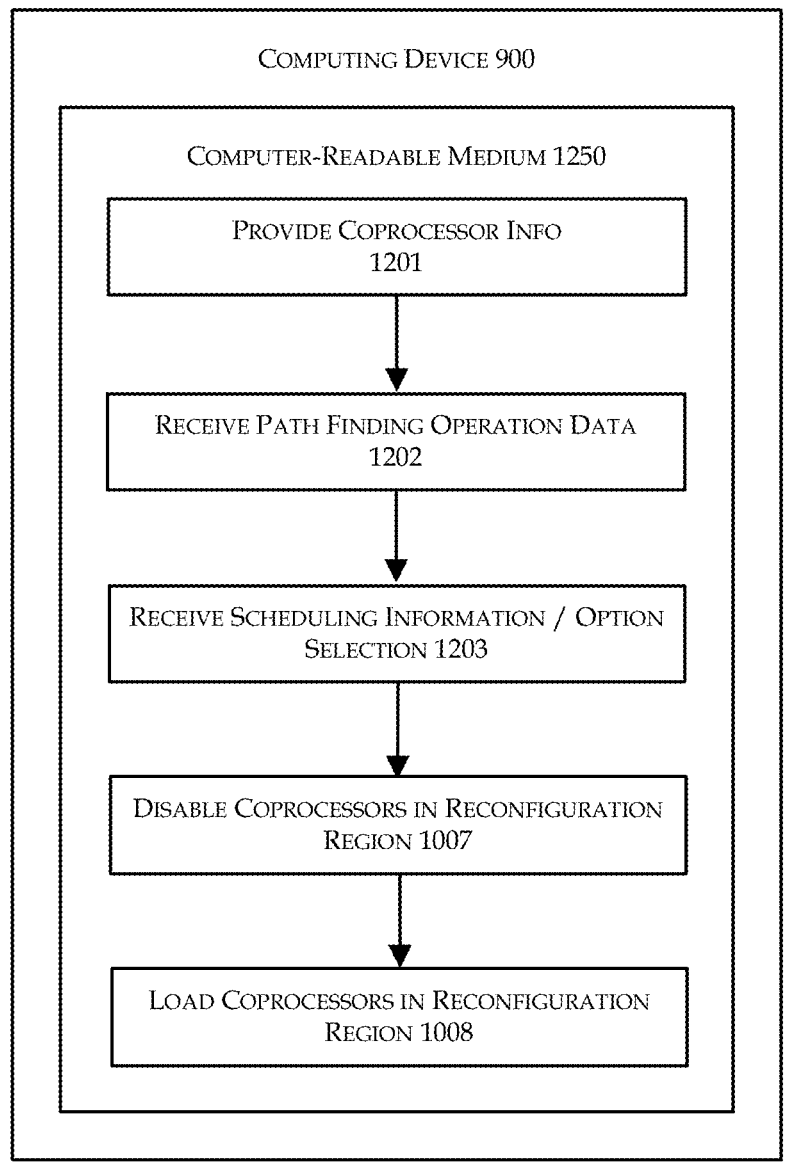
FIG. 12 is a flow diagram illustrating an example configuration controller method.

FIG. 12 is a flow diagram illustrating an example configuration controller method, arranged in accordance with at least some embodiments of the present disclosure. The example flow diagram may include one or more operations/modules as illustrated by blocks 1201-1203, 1007, and 1008 which represent operations as may be performed in a method, functional modules in a computing device 900, and/or instructions as may be recorded on a computer readable medium 1250.

In FIG. 12, blocks 1201-1203, 1007, and 1008 are illustrated as being performed sequentially, e.g., with block 1201 first and block 1008 last. It will be appreciated however that these blocks may be re-arranged as convenient to suit particular embodiments and that these blocks or portions thereof may be performed concurrently in some embodiments. It will also be appreciated that in some examples various blocks may be eliminated, divided into additional blocks, and/or combined with other blocks.

FIG. 12 illustrates an example method by which a configuration controller in computing device 900 may participate in a method for dynamically assigning coprocessor regions in an FPGA such as illustrated in FIG. 10. FIG. 12 includes blocks 1007 and 1008 from FIG. 10, to indicate that the configuration controller may perform these blocks of FIG. 10, along with blocks 1201-1203 as described below.

At a "Provide Coprocessor Info" block 1201, the configuration controller may provide coprocessor information to a programmable hardware optimizer. The coprocessor information may comprise, inter alia, a starting arrangement of coprocessor regions within an FPGA, and identifications of desired coprocessors that may be beneficially included in the FPGA. The starting arrangement of coprocessor regions may comprise a 2D or a 3D arrangement, depending on whether the FPGA provides a 2D 3D region. Likewise, desired coprocessors may occupy 2D or 3D regions. Identifications of desired coprocessors may be provided as configware identifiers in some embodiments. In some embodiments, the configuration controller may provide dimensions of desired coprocessors. In some embodiments, the programmable hardware optimizer may retrieve dimensions of desired coprocessors from another source such a configware library. In some embodiments, the configuration controller may provide coprocessor information in response to a request from the programmable hardware optimizer. In some embodiments, the configuration controller may automatically provide coprocessor information to the programmable hardware optimizer, without necessarily receiving requests. Block 1201 may be followed by block 1202.

At a "Receive Path Finding Operation Data" block 1202, the configuration controller may receive path finding operation data from the programmable hardware optimizer. It will be appreciated with the benefit of this disclosure that the path finding operation data may be configured in a variety of ways. In some embodiments, path finding operation data may comprise data for multiple path finding operations to be performed in series, while in other embodiments, path finding operation data may comprise data for one path finding operation at a time.

In some embodiments, path finding operation data may comprise data for multiple different path finding options. Each path finding option, also referred to herein as reconfiguration option, may comprise an identified reconfiguration region, identifications of one or more coprocessors and one or more new coprocessor regions within the identified reconfiguration region. When path finding operation data includes multiple reconfiguration options, the configuration controller may receive a reconfiguration option selection, e.g., from the hypervisor as discussed herein, and the configuration controller may load, e.g., during reduced activity of affected VMs, the identified coprocessors for the in the selected reconfiguration option in new coprocessor regions according to the reconfiguration option selection.

Furthermore, in some embodiments, path finding operation data may comprise identifications of reconfiguration region(s) within the FPGA, as well as identifications of one or more coprocessors and corresponding new coprocessor regions within the reconfiguration region. In some embodiments, path finding operation data may comprise identifications of one or more coprocessors and one or more new coprocessor regions without an explicit identification of reconfiguration region, because reconfiguration region may optionally be determined at any stage using new coprocessor regions. Block 1202 may be followed by block 1203.

At a "Receive Scheduling Information/Option Selection" block 1203, the configuration controller may optionally receive a reconfiguration option selection (when more than one option is available), and the configuration controller may receive scheduling information indicating when coprocessors that occupy coprocessor regions within a reconfiguration region have reduced activity due to reduced execution time for VMs using the coprocessors in the reconfiguration region. The received scheduling information may comprise, e.g., hypervisor scheduling information. Block 1203 may be followed by blocks 1007 and 1008.

At a "Disable Coprocessors in Reconfiguration Region" block 1007 and a "Load Coprocessors in Reconfiguration Region" block 1008, the configuration controller may disable coprocessors and load new coprocessors new coprocessor regions within a reconfiguration region, for example as described in connection with FIG. 10. In some embodiments, blocks 1007 and 1008 may be performed at a scheduled time corresponding to reduced activity of affected VMs, pursuant to scheduling information received at block 1203. In some embodiments, received scheduling information may take the form of a command to perform a path finding operation immediately, in which case configuration controller may perform a path finding operation substantially immediately in response to the command.

Figure 13:
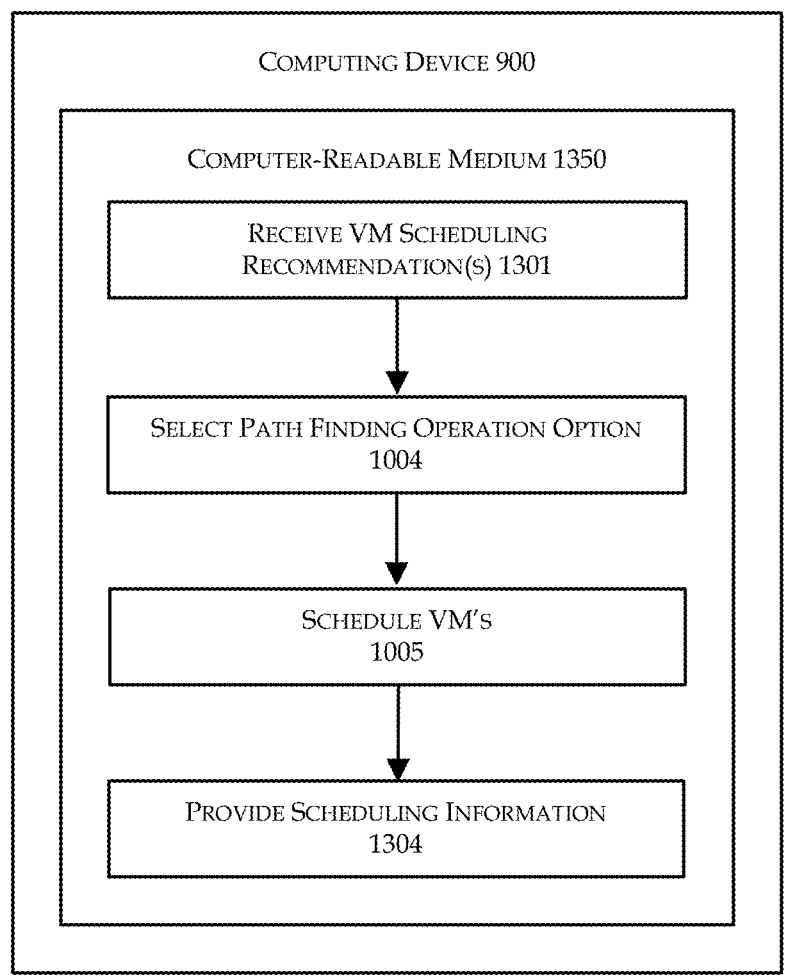
FIG. 13 is a flow diagram illustrating an example hypervisor method.

FIG. 13 is a flow diagram illustrating an example hypervisor method, arranged in accordance with at least some embodiments of the present disclosure. The example flow diagram may include one or more operations/modules as illustrated by blocks 1301, 1004, 1005, and 1304, which represent operations as may be performed in a method, functional modules in a computing device 900, and/or instructions as may be recorded on a computer readable medium 1350.

In FIG. 13, blocks 1301, 1004, 1005, and 1304 are illustrated as being performed sequentially, e.g., with block 1301 first and block 1304 last. It will be appreciated however that these blocks may be re-arranged as convenient to suit particular embodiments and that these blocks or portions thereof may be performed concurrently in some embodiments. It will also be appreciated that in some examples various blocks may be eliminated, divided into additional blocks, and/or combined with other blocks.

FIG. 13 illustrates an example method by which a hypervisor in computing device 900 may participate in a method for dynamically assigning coprocessor regions in an FPGA such as illustrated in FIG. 10. FIG. 13 includes blocks 1301 and 1304 from FIG. 10, to indicate that the hypervisor may perform these blocks of FIG. 10, along with blocks 1004 and 1005 as described below.

At a "Receive VM Scheduling Recommendation(s)" block 1301, the hypervisor may for example receive one or more VM scheduling recommendations for VMs that use coprocessors in a reconfiguration region within an FPGA, the VM scheduling recommendations recommending scheduling the VMs according to coprocessor availability during reconfiguration of the reconfiguration region by reducing execution time of the VMs during reconfiguration of the reconfiguration region. In some embodiments, the scheduling recommendations may be in the form of path finding operation data, e.g., as discussed in connection with FIG. 8. Block 1301 may be followed by blocks 1004 and 1005.

At a "Select Path Finding Operation Option" block 1004 and a "Schedule VM's" block 1005, the hypervisor may perform operations described in connection with FIG. 10. In embodiments in which the scheduling recommendations received at block 1301 comprise multiple VM scheduling recommendations corresponding to multiple path finding operation selections, the hypervisor may select, at block 1004, a VM scheduling recommendation from among the multiple VM scheduling recommendations. At block 1005, the hypervisor schedule VMs according to the VM scheduling recommendations, e.g., the VM scheduling recommendations selected at block 1004, by reducing execution time of affected VMs while allowing one or more VMs that use coprocessors in regions other than the reconfiguration region within the FPGA to have normal or increased execution time. As disclosed herein, reducing execution time may be done at to any appropriate degree, up to and including providing no execution time to affected VMs during the time when the execution time is reduced. Blocks 1004 and 1005 may be followed by block 1304.

At a "Provide Scheduling Information" block 1304, the hypervisor may for example provide, for use by a configuration controller, scheduling information indicating when execution time is reduced for affected VMs in a path finding operation. The scheduling information may comprise any information effective to adapt the configuration controller to reconfigure a reconfiguration region during a time when the execution time for affected VMs is reduced. In some embodiments, the hypervisor may provide path finding operation option selection information for use by the configuration controller along with the scheduling information. In some embodiments, the scheduling information may relate to multiple path finding operations, e.g., a series of path finding operations to be performed in sequence, while in other embodiments, the scheduling information may relate to one path finding operation at a time.

Figure 14:
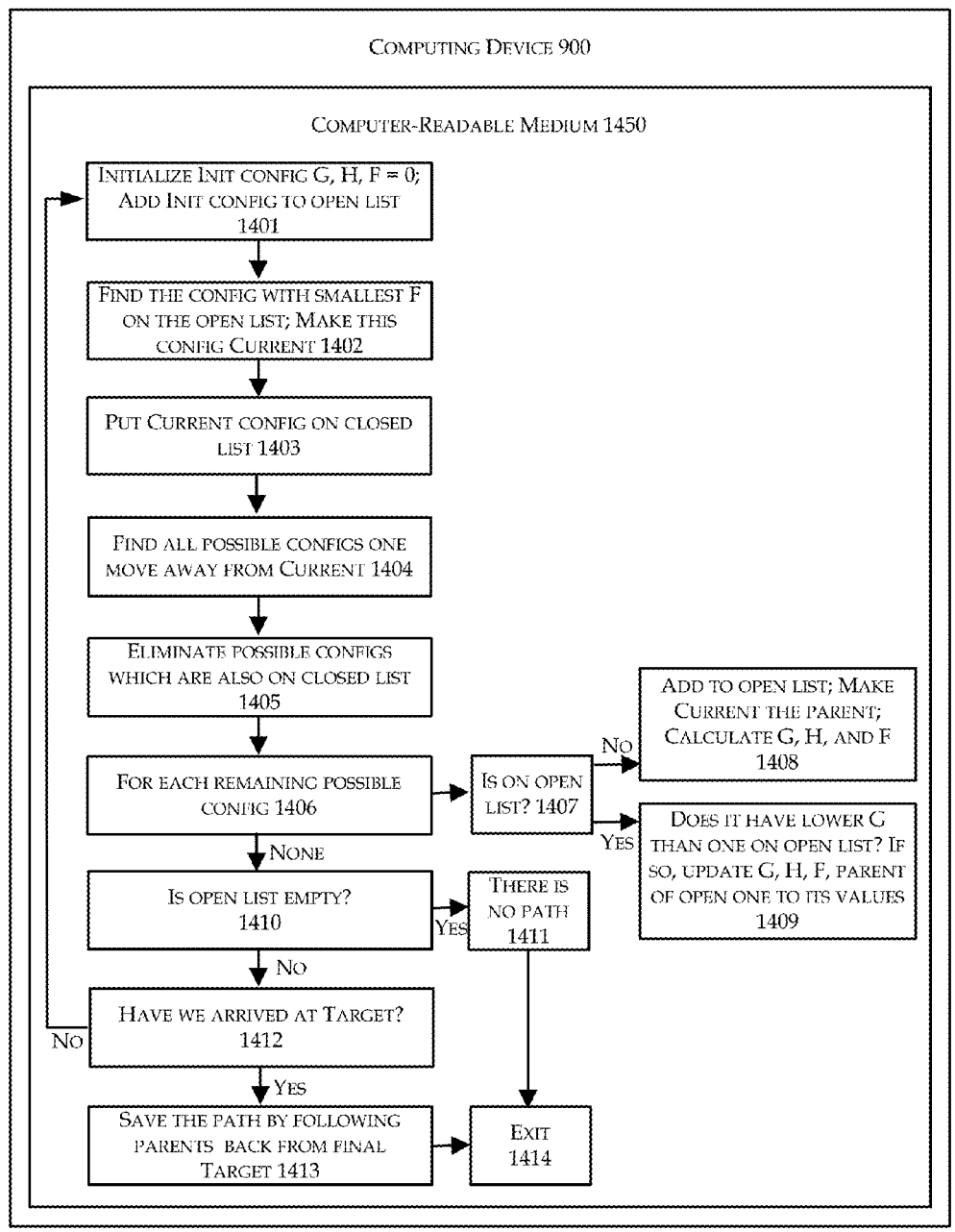
FIG. 14 is a flow diagram illustrating an example path finding algorithm; all arranged in accordance with at least some embodiments of the present disclosure.

FIG. 14 is a flow diagram illustrating an example path finding algorithm, arranged in accordance with at least some embodiments of the present disclosure. The example flow diagram may include one or more operations/modules as illustrated by blocks 1401-1414, which represent operations as may be performed in a method, functional modules in a computing device 900, and/or instructions as may be recorded on a computer readable medium 1450.

In FIG. 14, blocks 1401-1414 are illustrated as including blocks that may be performed sequentially, e.g., with block 1401 first and block 1414 last. It will be appreciated however that these blocks may be re-arranged as convenient to suit particular embodiments and that these blocks or portions thereof may be performed concurrently in some embodiments. It will also be appreciated that in some examples various blocks may be eliminated, divided into additional blocks, and/or combined with other blocks.

FIG. 14 illustrates an example method by which a programmable hardware optimizer in computing device 900 may perform a path finding algorithm. Recognizing that numerous path finding algorithms are possible, FIG. 14 illustrates an example method comprising an A* algorithm to solve a fifteen puzzle. The example algorithm may be modified as appropriate to suit particular embodiments. The example algorithm includes two functions: G and H. G is how far we have traveled from the initial configuration, and H is a "heuristic" to estimate how far we are from the target configuration. Distance traveled is the number of steps from the initial configuration. For H, the number of rectangles that are not in the target position may be used. The algorithm minimizes a function F, which may be defined as, for example, G+H.

At an "Initialize init config G, H, F=0; Add init config to open list" block 1401, the programmable hardware optimizer may initialize an initial configuration "init config", set functions G, H, and F to zero, and add init config to an open list. Block 1401 may be followed by block 1402.

At a "Find the config with smallest F on the open list; Make this config Current" block 1402, the programmable hardware optimizer may find a configuration with a smallest F function on the open list, and may make the configuration with smallest F the "current configuration". Block 1402 may be followed by block 1403.

At a "Put current config on closed list" block 1403, the programmable hardware optimizer may put the current configuration on a closed list. Block 1403 may be followed by block 1404.

At a "Find all possible configs one move away from current" block 1404, the programmable hardware optimizer may find all possible configurations that are one move away from the current configuration. Block 1404 may be followed by block 1405.

At an "Eliminate possible configs which are also on closed list" block 1405, the programmable hardware optimizer may eliminate possible configurations from those found at block 1404, which are also on the closed list. Block 1405 may be followed by block 1406.

At a "For each remaining possible config" block 1406, the programmable hardware optimizer may take up each of the remaining possible configurations found at block 1404 and not eliminated at block 1405. Block 1406 may be followed by block 1407, when there are remaining possible configurations, or by block 1410 when there are no remaining possible configurations.

At an "Is on open list?" block 1407, the programmable hardware optimizer may check whether a remaining possible configuration taken up at block 1406 is on the open list. Block 1407 may be followed by block 1408 or block 1409.

At an "Add to open list; Make Current the parent; Calculate G, H, and F" block 1408, when a remaining possible configuration taken up at block 1406 is on the open list, the programmable hardware optimizer may Add the configuration to the open list; Make the parent of the configuration taken up at block 1406 the current configuration, and calculate the functions G, H, and F.

At a "Does it have lower G than one on open list? If so, update G, H, F, parent of open one to its values" block 1409, when a remaining possible configuration taken up at block 1406 is not on the open list, the programmable hardware optimizer may check whether the configuration has a lower G function value than configurations on the open list. If so, block 1409 may update values for functions G, H, and F, for a parent configuration of the open configuration.

At an "Is open list empty?" block 1410, the programmable hardware optimizer may determine whether the open list is empty. Block 1410 may be followed by block 1411 or block 1412.

At a "There is no path" block 1411, when the open list is determined to be empty at block 1410, the programmable hardware optimizer may conclude that there is no path. Block 1411 may be followed by block 1414.

At a "Have we arrived at target?" block 1412, the programmable hardware optimizer may determine whether the target configuration has been reached. Block 1412 may be followed by block 1401, when the target configuration has not been reached, or by block 1413 when the target configuration has been reached.

At a "Save the path by following parents back from final target" block 1413, when the target configuration has been reached as determined at block 1412, the programmable hardware optimizer may save the path by following parents back from the final Target. Block 1413 may be followed by block 1414.

At an "Exit" block 1414, the programmable hardware optimizer may exit. When exiting due concluding there is no path at block 1411, in some embodiments, a different path finding algorithm may be initiated.

The fifteen puzzle is one version of the problem of rearranging rectangles (such as rectangular coprocessor regions) through a sequence of moves. Other versions may include rectangles of different sizes, and may allow the ability to choose reconfiguration regions of any arbitrary size less than the full puzzle size, which reconfiguration regions may comprise multiple rectangles. Algorithms according to FIG. 14 may be modified as appropriate to address such other problem versions. For example, algorithms may create a set of possible moves for each configuration, such as by removing rectangles (coprocessors) in a given vertical or horizontal region, then replacing them with other coprocessors, which other coprocessors may or may not already be loaded in an FPGA. Then, functions for G and H may be included to guide the algorithm as desired.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely examples and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly inter-actable and/or wirelessly interacting components and/or logically interacting and/or logically inter-actable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While certain example techniques have been described and shown herein using various methods, devices and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

The invention claimed is:

1. A method to dynamically assign coprocessor regions in a Field Programmable Gate Array (FPGA), the method comprising:
   dynamically executing a placement algorithm to determine at least one resource efficient arrangement of coprocessor regions within the FPGA, wherein the at least one resource efficient arrangement of coprocessor regions is at least more resource efficient than a starting arrangement of coprocessor regions by using more of the FPGA for coprocessor regions than is used by the starting arrangement of coprocessor regions;
   dynamically executing a path finding algorithm to determine multiple path finding operations to transition the FPGA from the starting arrangement of coprocessor regions to the resource efficient arrangement of coprocessor regions, each path finding operation comprising:
      establishing a different reconfiguration region of the FPGA, different from reconfiguration regions for other path finding operations, wherein at least one coprocessor region is outside the different reconfiguration region, and wherein at least one coprocessor region is inside the different reconfiguration region;
      disabling coprocessors having coprocessor regions in the different reconfiguration region while allowing coprocessors having coprocessor regions outside the different reconfiguration region to continue to operate;
      assigning one or more new coprocessor regions in the different reconfiguration region; and
      loading coprocessors in each of the one or more new coprocessor regions; and
   dynamically performing the multiple path finding operations to transition the FPGA from the starting arrangement of coprocessor regions to the resource efficient arrangement of coprocessor regions.

2. The method of claim 1, further comprising scheduling Virtual Machines (VMs) that use coprocessors in the coprocessor regions within the FPGA according to coprocessor availability during performance of the multiple path finding operations, so that VMs using coprocessors that are disabled during a path finding operation are provided with reduced execution time during the path finding operation.

3. The method of claim 2, wherein the reduced execution time during the path finding operation is substantially no execution time during the path finding operation.

4. The method of claim 2, wherein the scheduling VMs comprises making one or more VM scheduling recommendations to a hypervisor effective to configure the hypervisor to perform the scheduling.

5. The method of claim 1, wherein the placement algorithm comprises a greedy algorithm, a first fit algorithm, a best fit decreasing algorithm, or a first-fit decreasing algorithm.

6. The method of claim 1, wherein the path finding algorithm comprises a best fit search algorithm, an A* algorithm, a B* algorithm, a beam search algorithm, or a Dijkstra's algorithm.

7. A non-transitory computer readable storage medium having computer executable instructions executable by a processor, the instructions that, when executed by the processor, implement a programmable hardware optimizer, which causes the processor to:
   dynamically execute a placement algorithm to determine at least one resource efficient arrangement of coprocessor regions within a Field Programmable Gate Array (FPGA), wherein the at least one resource efficient arrangement of coprocessor regions is at least more resource efficient than a starting arrangement of coprocessor regions by using more of the FPGA for coprocessor regions than is used by the starting arrangement of coprocessor regions;
   dynamically execute a path finding algorithm to determine multiple path finding operations to transition the FPGA from the starting arrangement of coprocessor regions to the resource efficient arrangement of coprocessor regions, each path finding operation comprising:
      establishing a different reconfiguration region of the FPGA, different from reconfiguration regions for other path finding operations, wherein at least one coprocessor region is outside the different reconfiguration region, and wherein at least one coprocessor region is inside the different reconfiguration region;
      disabling coprocessors having coprocessor regions in the different reconfiguration region while allowing coprocessors having coprocessor regions outside the different reconfiguration region to continue to operate;
      assigning one or more new coprocessor regions in the different reconfiguration region; and
      loading coprocessors in each of the one or more new coprocessor regions; and
   dynamically perform the multiple path finding operations to transition the FPGA from the starting arrangement of coprocessor regions to the resource efficient arrangement of coprocessor regions.

8. A computing device configured to provide a programmable hardware optimizer, comprising:
   a processor;
   a memory; and
   a programmable hardware optimizer stored in the memory and executable by the processor, wherein the programmable hardware optimizer is configured to:
      dynamically execute a placement algorithm to determine at least one resource efficient arrangement of a plurality of coprocessor regions within a Field Programmable Gate Array (FPGA), wherein the at least one resource efficient arrangement of coprocessor regions is at least more resource efficient than a starting arrangement of coprocessor regions by using more of the FPGA for coprocessor regions than is used by the starting arrangement of coprocessor regions;

dynamically execute a path finding algorithm to determine multiple path finding operations to transition the FPGA from the starting arrangement of coprocessor regions to the resource efficient arrangement of coprocessor regions, each path finding operation comprising:

establishing a different reconfiguration region of the FPGA, different from reconfiguration regions for other path finding operations, wherein at least one coprocessor region is outside the different reconfiguration region, and wherein at least one coprocessor region is inside the different reconfiguration region;

disabling coprocessors having coprocessor regions in the different reconfiguration region while allowing coprocessors having coprocessor regions outside the different reconfiguration region to continue to operate;

assigning one or more new coprocessor regions in the different reconfiguration region; and loading coprocessors in each of the one or more new coprocessor regions; and dynamically perform the multiple path finding operations to transition the FPGA from the starting arrangement of coprocessor regions to the resource efficient arrangement of coprocessor regions.

9. The computing device of claim 8, wherein the computing device is configured to schedule Virtual Machines (VMs) that use coprocessors in the coprocessor regions within the FPGA according to coprocessor availability during performance of the multiple path finding operations, so that VMs using coprocessors that are disabled during a path finding operation are provided with reduced execution time during the path finding operation.

10. The computing device of claim 9, wherein the reduced execution time during the path finding operation is substantially no execution time during the path finding operation.

11. The computing device of claim 9, wherein the scheduling VMs comprises making one or more VM scheduling recommendations to a hypervisor effective to configure the hypervisor to perform the scheduling.

12. The computing device of claim 8, wherein the placement algorithm is applied to determine multiple resource efficient arrangements of coprocessor regions within the FPGA, and wherein the computing device is configured to determine multiple path finding operation options, each of the multiple path finding operation options corresponding to a respective one of the multiple resource efficient arrangements of coprocessor regions.

13. The computing device of claim 12, wherein the programmable hardware optimizer is configured to make multiple Virtual Machine (VM) scheduling recommendations to a hypervisor, wherein each of the multiple VM scheduling recommendations correspond to a respective one of the multiple path finding operation options.

14. The computing device of claim 13, wherein the computing device is configured to perform a path finding operation option corresponding to a hypervisor selected VM scheduling recommendation in response to selection by the hypervisor of the VM scheduling recommendation from among the multiple VM scheduling recommendations.

15. The computing device of claim 8, wherein the computing device is configured to provide a configware identifier for each of the one or more new coprocessor regions to a configuration controller, in order to adapt the configuration controller to load identified configware in each of the one or more new coprocessor regions, and wherein loading identified configware is effective to load coprocessors in each of the one or more new coprocessor regions.

16. The computing device of claim 8, wherein the placement algorithm comprises a greedy algorithm, a first fit algorithm, a best fit decreasing algorithm, or a first-fit decreasing algorithm.

17. The computing device of claim 8, wherein the path finding algorithm comprises a best fit search algorithm, an A* algorithm, a B* algorithm, a beam search algorithm, or a Dijkstra's algorithm.

* * * * *